United States Patent
Tanaka et al.

(10) Patent No.: US 10,784,319 B2
(45) Date of Patent: Sep. 22, 2020

(54) FLEXIBLE DISPLAY PANEL, FLEXIBLE DISPLAY DEVICE, AND METHOD FOR PRODUCING FLEXIBLE DISPLAY PANEL

(71) Applicant: Sharp Kabushiki Kaisha, Sakai, Osaka (JP)

(72) Inventors: Tetsunori Tanaka, Sakai (JP); Shoji Okazaki, Sakai (JP); Yuki Yasuda, Sakai (JP)

(73) Assignee: Sharp Kabushiki Kaisha, Sakai (JP)

(*) Notice: Subject to any disclaimer, the term of this patent is extended or adjusted under 35 U.S.C. 154(b) by 0 days.

(21) Appl. No.: 16/064,509

(22) PCT Filed: Mar. 8, 2017

(86) PCT No.: PCT/JP2017/009323
§ 371 (c)(1),
(2) Date: Sep. 13, 2018

(87) PCT Pub. No.: WO2018/163337
PCT Pub. Date: Sep. 13, 2018

(65) Prior Publication Data
US 2019/0363142 A1    Nov. 28, 2019

(51) Int. Cl.
*H01L 27/32* (2006.01)
*H01L 51/00* (2006.01)
*H01L 51/52* (2006.01)
*H01L 51/56* (2006.01)

(52) U.S. Cl.
CPC ...... *H01L 27/3244* (2013.01); *H01L 51/0097* (2013.01); *H01L 51/5253* (2013.01); *H01L 51/56* (2013.01)

(58) Field of Classification Search
CPC ............ H01L 52/5253; H01L 51/003; H01L 2227/326; H01L 2221/68381; H01L 51/0097; H01L 27/3244; H01L 21/02488
See application file for complete search history.

(56) References Cited

U.S. PATENT DOCUMENTS

| | | | |
|---|---|---|---|
| 2003/0047280 A1* | 3/2003 | Takayama | B32B 7/06 156/708 |
| 2011/0294244 A1 | 12/2011 | Hattori et al. | |
| 2014/0145587 A1* | 5/2014 | Yoon | H01L 21/6835 313/512 |
| 2014/0353625 A1 | 12/2014 | Yi et al. | |

(Continued)

FOREIGN PATENT DOCUMENTS

| | | |
|---|---|---|
| JP | 2008-242249 A | 10/2008 |
| JP | 2009-199777 A | 9/2009 |

(Continued)

OTHER PUBLICATIONS

Official Communication issued in International Patent Application No. PCT/JP2017/009323, dated Jun. 6, 2017.

*Primary Examiner* — Alia Sabur
(74) *Attorney, Agent, or Firm* — Keating & Bennett, LLP

(57) ABSTRACT

An organic EL element including light emitting layers is formed above a first region of a main surface of a back film. A plurality of terminal portions are formed above a second region of the main surface of the back film. A cover film including an opening is provided as an uppermost layer above the main surface of the back film.

17 Claims, 17 Drawing Sheets

(56) References Cited

U.S. PATENT DOCUMENTS

| | | | |
|---|---|---|---|
| 2015/0255740 A1* | 9/2015 | Nakada | H01L 51/0097 257/40 |
| 2016/0164030 A1 | 6/2016 | Yasuda | |
| 2016/0315134 A1* | 10/2016 | Nishido | H01L 27/3276 |
| 2016/0351641 A1* | 12/2016 | Ito | H01L 27/1266 |

FOREIGN PATENT DOCUMENTS

| | | | |
|---|---|---|---|
| JP | 2011-175753 A | 9/2011 | |
| JP | 2011-192567 A | 9/2011 | |
| JP | 2011-248072 A | 12/2011 | |
| JP | 2015-180930 A | 10/2015 | |
| JP | 2016-208020 A | 12/2016 | |
| JP | 2016-224427 A | 12/2016 | |
| WO | 2015/008642 A1 | 1/2015 | |

* cited by examiner

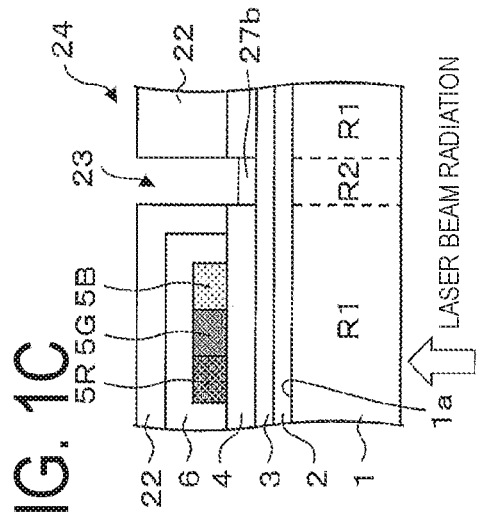
FIG. 1A   FIG. 1B   FIG. 1C
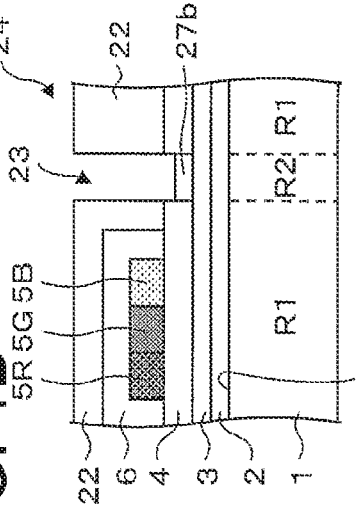
FIG. 1D
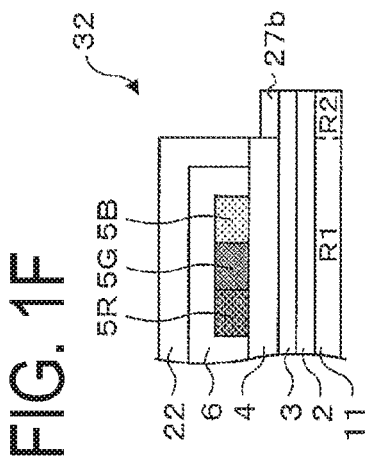
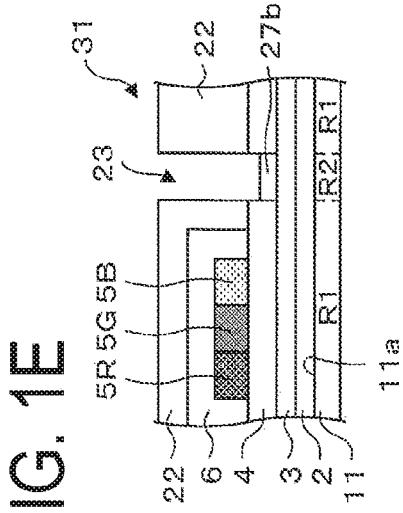
FIG. 1E
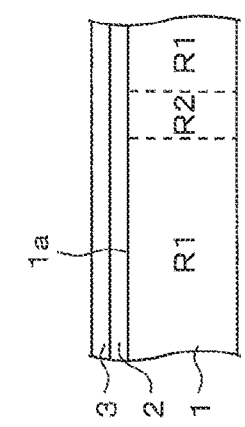
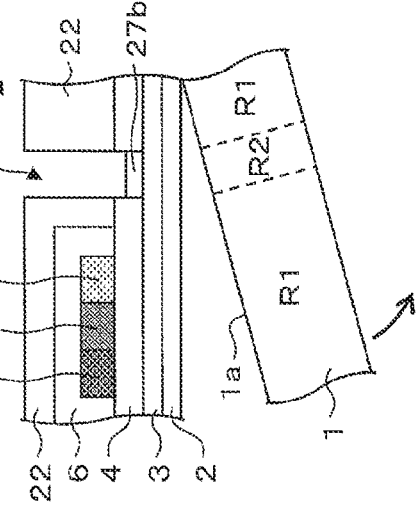
FIG. 1F

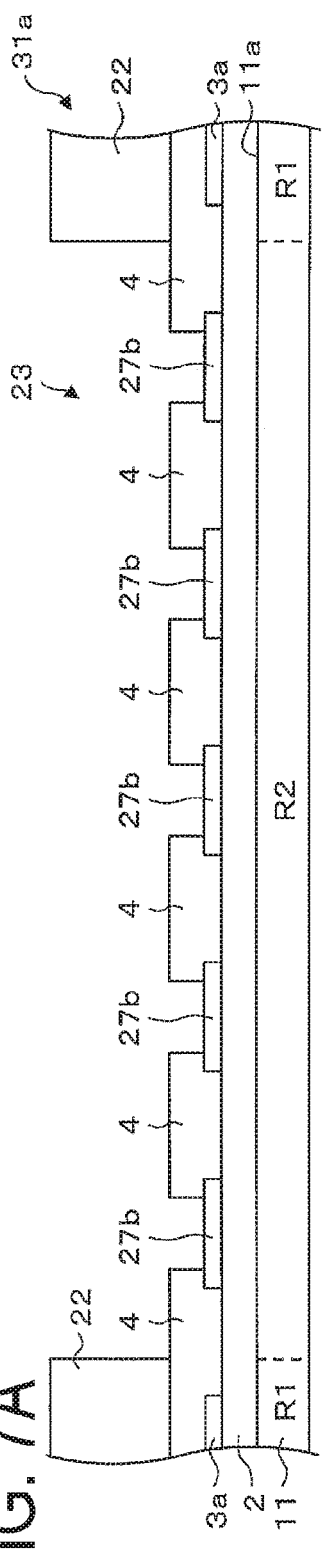
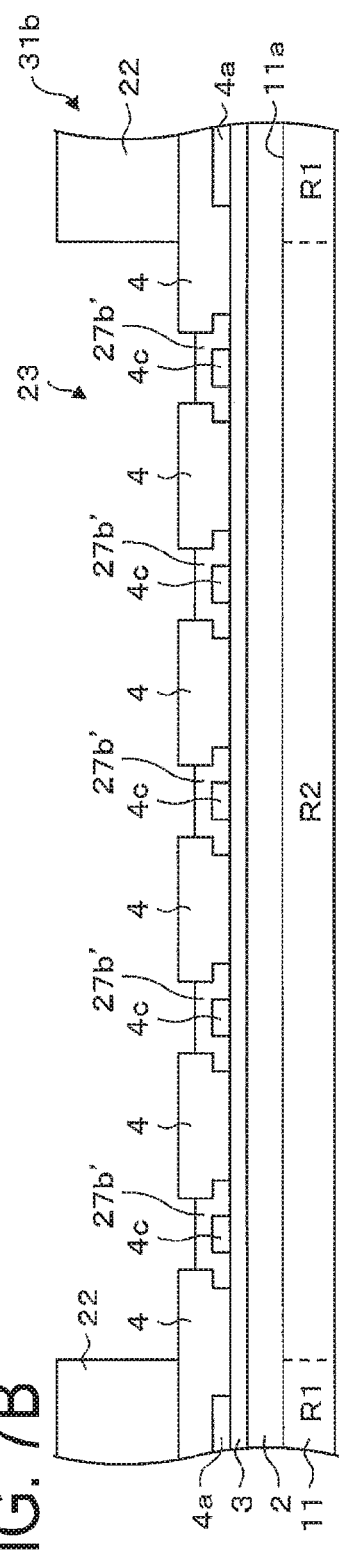

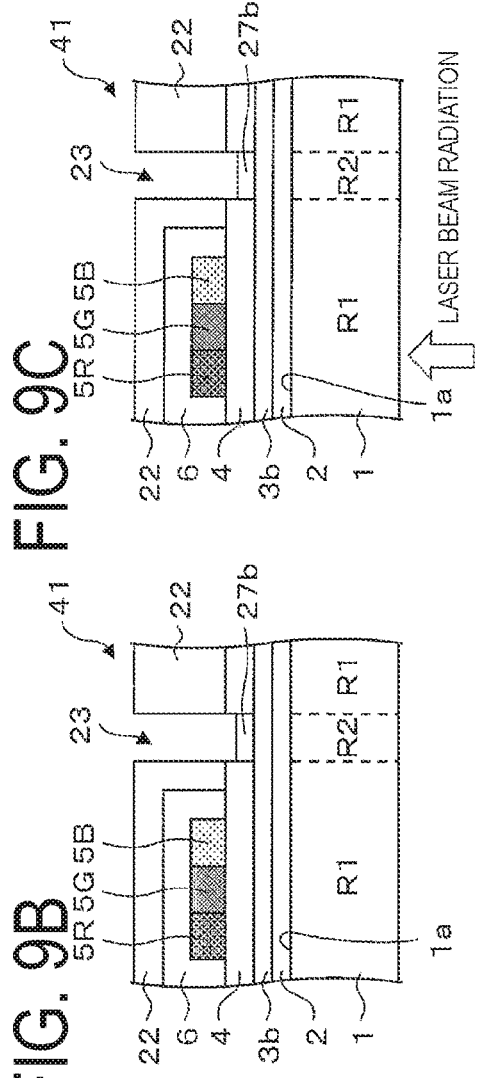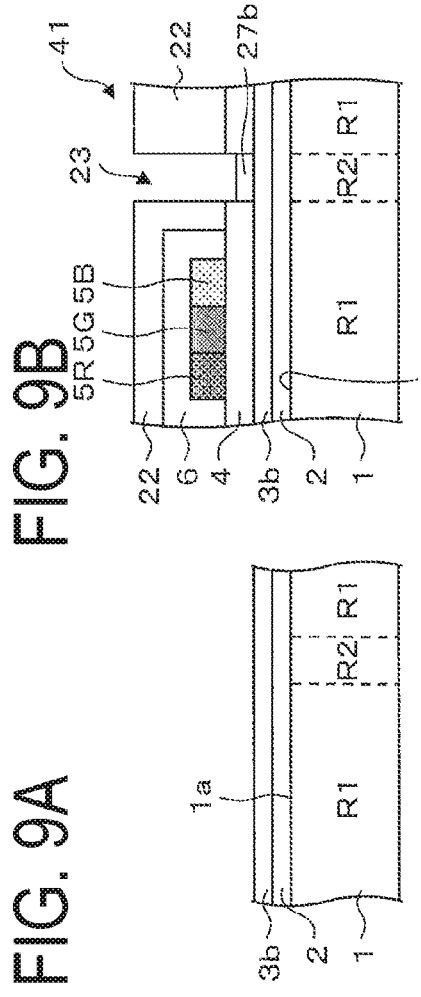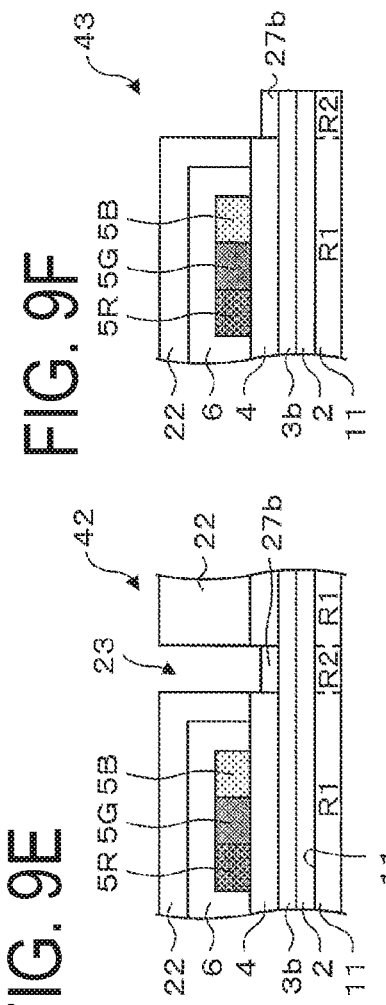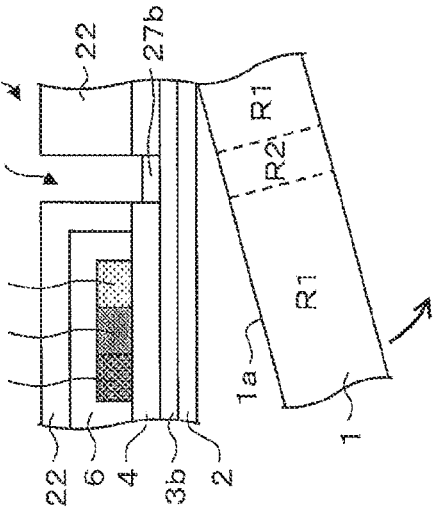

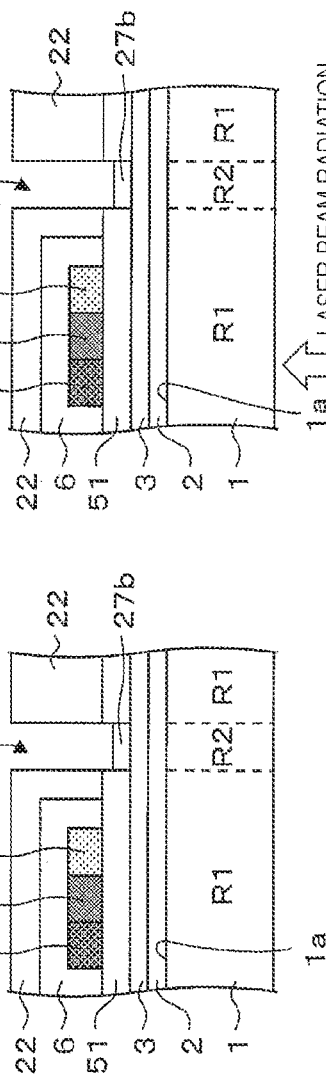
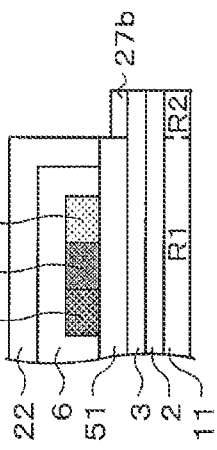
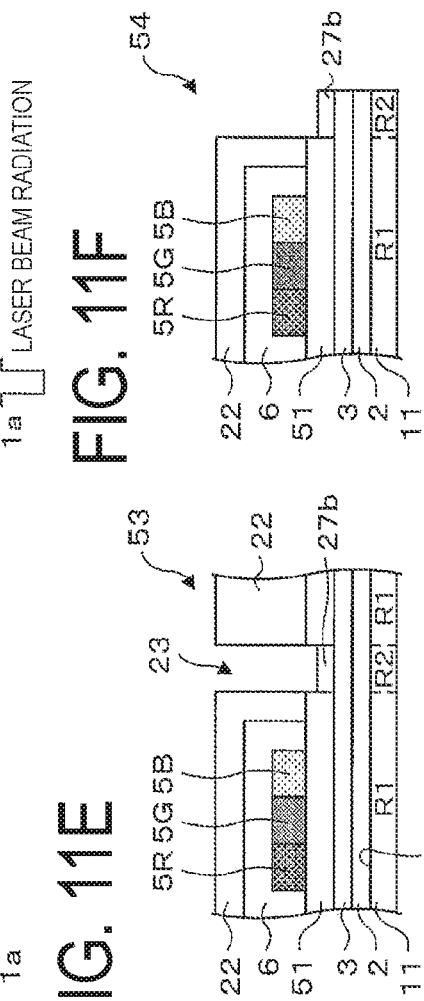
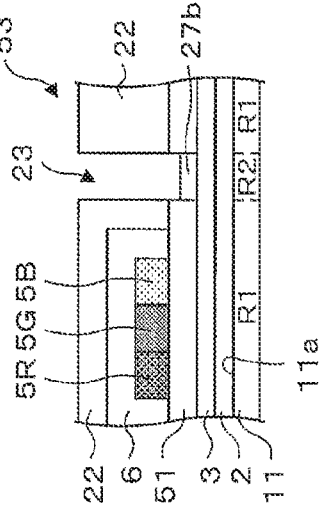
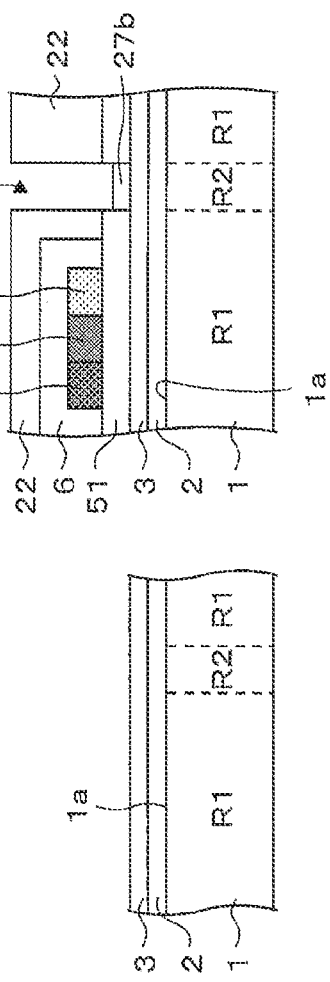
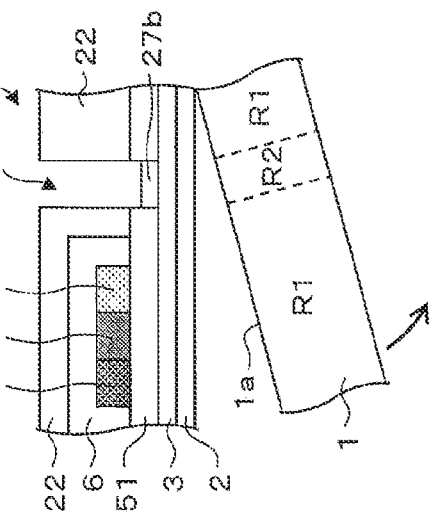

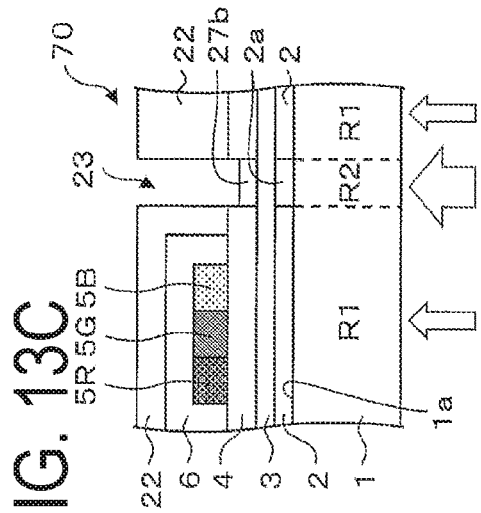
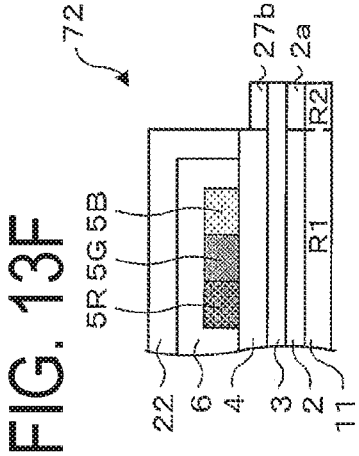
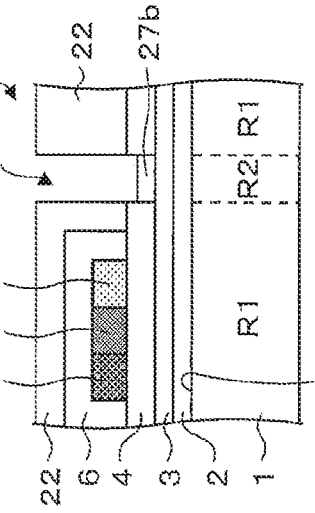
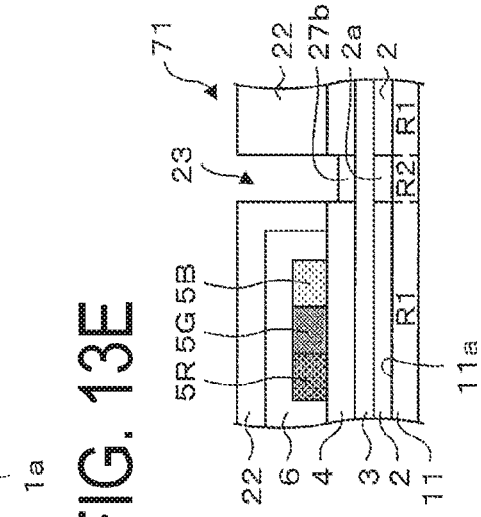
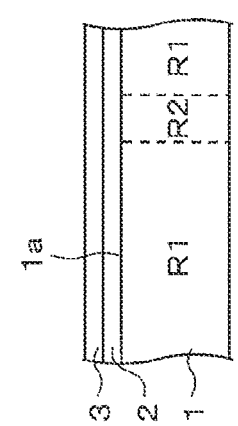
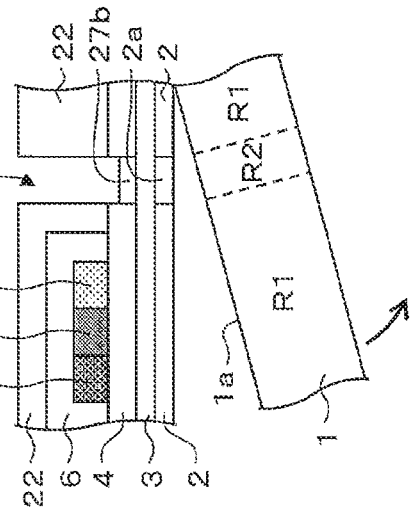

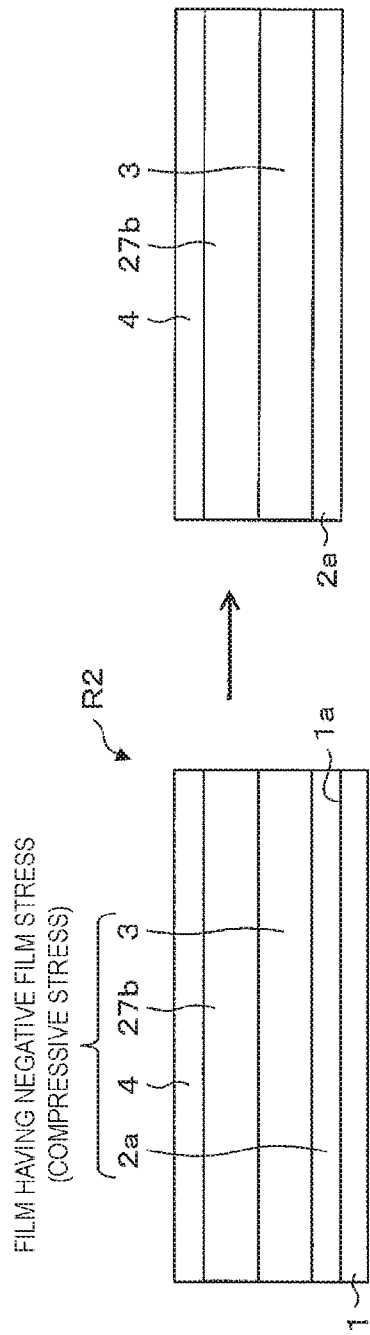

FLEXIBLE DISPLAY PANEL, FLEXIBLE DISPLAY DEVICE, AND METHOD FOR PRODUCING FLEXIBLE DISPLAY PANEL

TECHNICAL FIELD

The disclosure relates to a flexible display panel, a flexible display device formed by partitioning a flexible display panel, and a method for producing a flexible display panel.

BACKGROUND ART

In recent years, a flexible display device including a flexible display panel, such as a flexible liquid crystal display device and a flexible organic electroluminescence display device (flexible organic EL display device), has been attracted considerable attention because the flexible display device can be rolled up or folded to be stored or carried and can be worn like clothes.

For example, PTL 1 describes a flexible display device using a plastic film as a flexible substrate.

FIG. 15A is a diagram illustrating a step of transferring each layer formed on a glass substrate 120 as a temporary substrate to a plastic film 110 described in PTL 1. FIG. 15B is a diagram illustrating a schematic configuration of a flexible organic EL display 102 in which layers forming an organic EL element 106 are formed on the layers transferred onto the plastic film 110 and to which an external circuit wire 150 is connected.

As illustrated in FIG. 15A, a separation layer 122 formed of polyimide resin or the like is formed on the glass substrate 120 as the temporary substrate, and a transparent electrode 124 having a stripe shape is formed on the separation layer 122. A silica particle-containing resin layer 126 is formed to cover the separation layer 122 and the transparent electrode 124. A color filter 128 is formed on the silica particle-containing resin layer 126, and a light shielding layer is formed on the silica particle-containing resin layer 126 in a position corresponding to a region between patterns of the transparent electrode 124. The plastic film 110 is disposed to cover the color filter 128 and the light shielding layer mentioned above with an adhesive layer 130 therebetween.

Heat treatment is subsequently performed to cure the adhesive layer 130 and bond the plastic film 110 with the adhesive layer 130. Then, the adhesive layer 130, the color filter 128, the silica particle-containing resin layer 126, and the transparent electrode 124 are transferred onto the plastic film 110 by separating the glass substrate 120 and the separation layer 122.

As illustrated in FIG. 15B, in a display region A of the flexible organic EL display 102, a hole transport layer 172, a light emitting layer 174, a metal electrode (positive electrode) 176, and a sealing layer 178 are formed in order on layers of the plastic film 110, the adhesive layer 130, the color filter 128, the silica particle-containing resin layer 126, and the transparent electrode (negative electrode) 124, and the organic EL element 106 composed of the transparent electrode (negative electrode) 124, the hole transport layer 172, the light emitting layer 174, and the metal electrode (positive electrode) 176 is formed.

On the other hand, in an external connection region B of the flexible organic EL display 102, an external connection electrode 125 that is connected to the transparent electrode 124 and extends is disposed, and an electroless plating layer 140 that functions as a wire reinforcing layer is formed on the external connection electrode 125.

A wiring layer 154 of the external circuit wire 150 including the wiring layer 154 and a polyimide tape 152 layered and the electroless plating layer 140 are thermo-compressed and electrically connected to each other with an anisotropic conductive film (ACF) 160 including a binder 162 and a conductive particle 164 therebetween.

As described above, PTL 1 describes that the flexible organic EL display 102 to which the external circuit wire 150 is connected can be achieved.

CITATION LIST

Patent Literature

PTL 1: JP 2008-242249 A (published on Oct. 9, 2008).

SUMMARY

Technical Problem

However, for the flexible organic EL display 102 described in PTL 1, the hole transport layer 172, the light emitting layer 174, the metal electrode (positive electrode) 176, and the sealing layer 178 need to be formed in order on the layered layers of the plastic film 110, the adhesive layer 130, the color filter 128, the silica particle-containing resin layer 126, and the transparent electrode (negative electrode) 124, as illustrated in FIG. 15B.

Because the plastic film 110 has poor heat resistance, the hole transport layer 172, the light emitting layer 174, the metal electrode (positive electrode) 176, and the sealing layer 178 need to be formed by a relatively low-temperature step in the step of forming the hole transport layer 172, the light emitting layer 174, the metal electrode (positive electrode) 176, and the sealing layer 178 in consideration of heat resistance of the plastic film 110.

In this way, there is a problem that satisfactory light-emitting properties and life cannot be obtained in the organic EL element 106 formed by using the relatively low-temperature step.

To solve such a problem, a production method for forming an organic EL element on a glass substrate having high heat resistance, then separating the glass substrate to replace the glass substrate with a flexible substrate is conceivable as described below.

FIGS. 16A to 16F are diagrams illustrating the production method for forming an organic EL element on a glass substrate having high heat resistance, then separating the glass substrate to replace the glass substrate with a flexible substrate.

As illustrated in FIG. 16A, a PI layer 2 formed of polyimide resin or the like is first layered on a main surface 1a of a transparent glass substrate 1 having high heat resistance.

Subsequently, as illustrated in FIG. 16B, a thin film transistor element (TFT element) as an active element, and an insulating flattening film 4 to cover the thin film transistor element (TFT element) are formed on the PI layer 2. A first electrode (not illustrated) corresponding to an individual pixel patterned with the same conductive film and a terminal portion (not illustrated) are formed on the insulating flattening film 4. Then, after each of organic EL layers including light emitting layers (5R, 5G, 5B) is formed on the first electrode, a sealing film 6 is formed to cover each of the organic EL layers. A cover film 7 is formed to cover the entire region including the insulating flattening film 4, the terminal portion (not illustrated), and the sealing film 6 with an adhesive layer (not illustrated) therebetween, so that a non-flexible organic EL display panel 8 is completed.

Subsequently, as illustrated in FIG. 16C, laser beam irradiation is performed from the transparent glass substrate 1 side having high heat resistance. Accordingly, as illustrated in FIG. 16D, ablation occurs in an interface between the PI layer 2 and the transparent glass substrate 1 having high heat resistance, and the transparent glass substrate 1 having high heat resistance is then separated from the PI layer 2.

Next, as illustrated in FIG. 16E, a back film 11 as a flexible substrate is bonded to the PI layer 2 via an adhesive layer 10 on a main surface 11a of the back film 11, so that a flexible organic EL display panel 12 in which the terminal portion (not illustrated) is not exposed is completed.

Then, as illustrated in FIG. 16F, a step of exposing a terminal by removing part of the adhesive layer (not illustrated) and the cover film 7 is performed to expose a terminal portion formation region 13 as a region in which a plurality of terminal portions (not illustrated) are formed. Also, the flexible organic EL display panel 12 is partitioned by laser, and an external circuit wire (not illustrated) is connected to the terminal portions (not illustrated), to thereby obtain a plurality of flexible organic EL display devices 14.

FIG. 17 illustrates a large transparent glass substrate 1 having high heat resistance and a large back film 11 as a large flexible substrate used in the production method illustrated in FIGS. 16A to 16F.

FIG. 17A illustrates a case where a plurality of non-flexible organic EL display panels 8 illustrated in FIG. 16B are formed on the large transparent glass substrate 1 having high heat resistance. FIG. 17B illustrates a case where a plurality of flexible organic EL display panels 12 illustrated in FIG. 16E are formed on the large back film 11 by separating the large transparent glass substrate 1 having high heat resistance to replace the transparent glass substrate with the large back film 11 as the large flexible substrate.

As illustrated in FIG. 16F, a step of exposing a terminal is performed on the large back film 11 illustrated in FIG. 17B, the flexible organic EL display panel 12 is partitioned by laser, and an external circuit wire (not illustrated) is connected to the terminal portions (not illustrated), to thereby obtain the plurality of flexible organic EL display devices 14.

However, the production methods illustrated in FIGS. 16 and 17 described above need the step of exposing a terminal illustrated in FIG. 16F. The step of exposing a terminal produces a large amount of removed films removed from part of the adhesive layer and the cover film 7, and it takes time to completely clean the removed films because the removed films include the adhesive layer.

The disclosure has been made in view of the above-mentioned problems, and an object thereof is to provide a flexible display panel that reduces occurrence of wrinkles in a terminal portion without a need for a separate step of exposing a terminal and to provide a method for producing a flexible display panel.

Solution to Problem

To solve the above-mentioned problems, a flexible display panel of the disclosure is a flexible display panel including a plurality of display elements and a plurality of terminals on a main surface of a flexible substrate. The main surface of the flexible substrate is divided into a first region including one coupled region and a second region including a plurality of regions formed by being separated from each other. The plurality of display elements are formed above a display region as a part of the first region. The plurality of terminals are formed above the second region. A flexible film provided as an uppermost layer on the main surface of the flexible substrate includes an opening. The opening is disposed above the second region and has a shape surrounded by the flexible film.

According to the configuration above, the flexible film can support the film formed above the second region of the main surface of the flexible substrate. Thus, the flexible display panel that reduces occurrence of wrinkles in the film formed above the second region without a need for a separate step of exposing a terminal can be achieved.

To solve the above-mentioned problems, a method for producing a flexible display panel of the disclosure is a method for producing a flexible display panel including a plurality of display elements and a plurality of terminals on a main surface of a flexible substrate. The main surface of a heat-resistant substrate is divided into a first region including one coupled region and a second region including a plurality of regions formed by being separated from each other. The method for producing a flexible display panel includes a first step of forming a layered film above the first region and the second region, a second step of forming the plurality of display elements on the layered film above a display region as a part of the first region and forming the plurality of terminals on the layered film above the second region, a third step of providing a flexible film including an opening as an uppermost layer on the main surface of the heat-resistant substrate and disposing the opening having a shape surrounded by the flexible film above the second region, a fourth step of separating the heat-resistant substrate, and a fifth step of bonding the main surface of the flexible substrate to the surface from which the heat-resistant substrate is separated.

According to the method above, the flexible film can support the film formed above the second region of the main surface of the flexible substrate. Thus, the method for producing a flexible display panel that reduces occurrence of wrinkles in the film formed above the second region without a need for a separate step of exposing a terminal can be achieved.

Advantageous Effects of Disclosure

According to one aspect of the disclosure, a flexible display panel that reduces occurrence of wrinkles in a film formed above a second region without a need for a separate step of exposing a terminal and a method for producing a flexible display panel can be provided.

BRIEF DESCRIPTION OF DRAWINGS

FIGS. 1A to 1F are diagrams illustrating a method for producing a flexible organic EL display device that does not include a step of exposing a terminal.

FIG. 7 is a diagram illustrating a modified example of the terminal portion of the flexible organic EL display panel illustrated in FIG. 5.

FIGS. 9A to 9F are diagrams illustrating a method for producing a flexible organic EL display device that does not include a step of exposing a terminal.

FIGS. 11A to 11F are diagrams illustrating a method for producing a flexible organic EL display device that does not include a step of exposing a terminal.

FIGS. 13A to 13F are diagrams illustrating a method for producing a flexible organic EL display device that does not include a step of exposing a terminal.

FIG. 14 is a diagram illustrating a reason why occurrence of wrinkles or the like can be reduced in a layered film having negative film stress (compressive stress) after the stress is released in a case where the layered film having negative film stress (compressive stress) is separated from a transparent glass substrate having high heat resistance.

DESCRIPTION OF EMBODIMENTS

Figure 2:
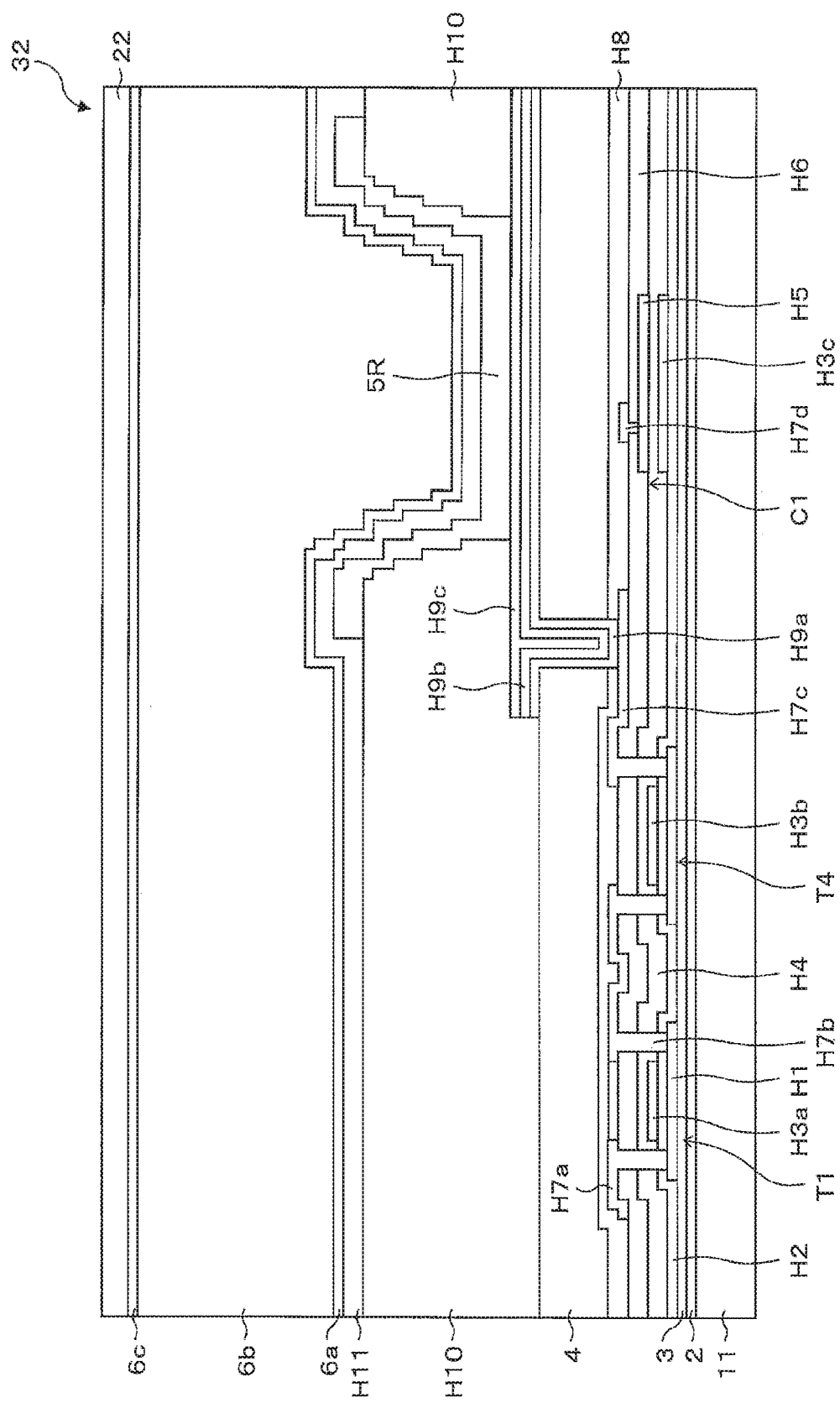
FIG. 2 is a diagram illustrating a schematic configuration above a first region of the flexible organic EL display device illustrated in FIG. 1F.

A description follows regarding embodiments of the disclosure, with reference to FIGS. 1A to 14. Hereinafter, for convenience of descriptions, a configuration having the same functions as those of a configuration described in a specific embodiment are denoted by the same reference numerals, and its descriptions may be omitted.

First Embodiment

A first embodiment of the disclosure will be described with reference to FIGS. 1A to 8.

FIGS. 1A to 1F are diagrams illustrating a method for producing a flexible organic EL display device 32 that does not include a step of exposing a terminal.

As illustrated in FIG. 1A, a PI layer 2 formed of polyimide resin or the like and an inorganic moisture-proof film 3 are first layered in order above a first region R1 and a second region R2 of a main surface 1a of a transparent glass substrate 1 having high heat resistance. Note that the first region R1 is a region in which a cover film 22 is formed in a subsequent step and the second region R2 is a region in which an opening 23 of the cover film 22 is formed. The main surface is one of an upper face and a lower face having a large area in the transparent glass substrate 1 having high heat resistance.

In the present embodiment, the transparent glass substrate 1 having high heat resistance is used, but this is not restrictive. Any substrate having high heat resistance and allowing transmission of part of a wavelength region of light used in a subsequent step can be used, and it is not particularly restrictive.

In the present embodiment, a technique for directly radiating an interface between the PI layer 2 and the transparent glass substrate 1 having high heat resistance with a laser beam (laser ablation) and separating the transparent glass substrate 1 having high heat resistance from the PI layer 2 is used, so that a heat absorbing layer or the like is not provided separately. However, a heat absorbing layer formed of amorphous silicon or metal (such as Mo and Ti) may be provided separately. In the case where a heat absorbing layer is provided separately, the heat absorbing layer rather than the PI layer 2 is radiated with a laser beam.

Note that the inorganic moisture-proof film 3 normally needs to be provided immediately on the PI layer 2 for preventing entry of moisture, oxygen, or the like, so that the inorganic moisture-proof film 3 is provided on the PI layer 2 in the present embodiment. As the inorganic moisture-proof film 3, a silicon oxide film, a silicon nitride film, a silicon oxynitride film, or a layered film of these formed by chemical vapor deposition (CVD), for example, can be used. Note that such a film that has high moisture-proof performance and can be used as the inorganic moisture-proof film 3 has been known that tends to normally have increased compressive stress, which will be described below in detail.

Subsequently, as illustrated in FIG. 1B, a thin film transistor element (TFT element) which is not illustrated, is formed on the PI layer 2 and the inorganic moisture-proof film 3 above the first region R1 and the second region R2 of the main surface 1a of the transparent glass substrate 1 having high heat resistance, and an insulating flattening film 4 is formed to cover the TFT element. Specifically, the TFT element is formed only in a display region in the first region R1, and the insulating flattening film 4 covering the TFT element is formed in the first region R1 and the second region R2.

In the present embodiment, a terminal portion 27b is formed in the same layer as a layer in which electrodes of TFT elements T1, T4, wires H7a, H7b, H7c, and a wire H7d connected to an upper electrode H5 of a capacitive element C1 are formed, as illustrated in FIG. 2. However, this is not restrictive, and the terminal portion 27b may be formed of, for example, a conductive film that forms a gate electrode H3a of the TFT element T1, a gate electrode H3b of the TFT element T4, and a lower electrode H3c of the capacitive element C1 or a conductive film that forms the upper electrode H5 of the capacitive element C1, as illustrated in FIG. 2. Furthermore, the terminal portion 27b may be formed of one or more layers of a transparent electrode layer H9a (such as an ITO layer) as a layer forming a first electrode, a reflective electrode layer H9b (such as a metal layer), and a transparent electrode layer H9c (such as an ITO layer), as illustrated in FIG. 2.

Note that the insulating flattening film 4 is a photosensitive organic material, and a contact hole is formed in the first region R1 and an opening exposing the terminal portion 27b is formed in the second region R2 in the insulating flattening film 4 by exposure and developing steps.

Then, a first electrode (not illustrated) electrically connected to the TFT element is formed on the insulating flattening film 4 as the display region in the first region R1 through the contact hole.

The opening 23 of the cover film 22 is arranged above the second region R2 of the main surface 1a of the transparent glass substrate 1 having high heat resistance. The terminal portion 27b is exposed from the opening 23 of the cover film 22. On the other hand, each of organic EL layers including light emitting layers (5R, 5G, 5B) is formed on the first electrode on the insulating flattening film 4, and a sealing film 6 and the cover film 22 are formed to cover each of the organic EL layers.

In the present embodiment, the cover film 22 having the opening 23 is formed on the sealing film 6 and the insulating flattening film 4 with an adhesive layer (not illustrated) therebetween, so that a non-flexible organic EL display panel 24 illustrated in FIG. 1B is completed. Note that a flexible and transparent resin film is used as the cover film 22 in the present embodiment, but this is not restrictive.

Subsequently, as illustrated in FIG. 1C, an interface between the PI layer 2 and the transparent glass substrate 1 having high heat resistance is directly radiated with a laser beam from the transparent glass substrate 1 side having high heat resistance, and the transparent glass substrate 1 having high heat resistance is then separated from the PI layer 2, as illustrated in FIG. 1D.

In the present embodiment, the interface between the PI layer 2 and the transparent glass substrate 1 having high heat resistance is radiated with a laser beam having a wavelength of less than or equal to 355 nm from the transparent glass substrate 1 side having high heat resistance. Specifically, a laser beam having a wavelength of less than or equal to 355 nm, which is light having a wavelength absorbed by the PI layer 2, is used in the present embodiment. For example, an excimer laser beam having a wavelength of 308 nm, a solid laser beam having a wavelength of 343 nm, and a solid laser beam having a wavelength of 355 nm can be used. Note that in a configuration including a heat absorbing layer (not illustrated), light having a wavelength absorbed by the heat absorbing layer can be used.

Next, as illustrated in FIG. 1E, a back film 11 as a flexible substrate is bonded to the PI layer 2 with the adhesive layer (not illustrated) therebetween, so that a flexible organic EL display panel 31 in which the terminal portion 27b is exposed is completed.

Then, as illustrated in FIG. 1F, a boundary portion between the first region R1 and the second region R2 (boundary portion on the right of the diagram) in the flexible organic EL display panel 31 illustrated in FIG. 1E is partitioned by laser, and an external circuit wire (not illustrated) is connected to the terminal portion 27b, to thereby obtain a plurality of flexible organic EL display devices 32.

FIG. 2 is a diagram illustrating a schematic configuration above the first region R1 of the flexible organic EL display device 32 illustrated in FIG. 1F.

As illustrated, the PI layer 2 and the inorganic moisture-proof film 3 are provided on the back film 11, and the TFT element T1 (drive transistor T1 in FIG. 3), the TFT element T4 (light emission control transistor T4 in FIG. 3), and the capacitive element C1 (capacitive element C1 in FIG. 3) are provided on the inorganic moisture-proof film 3.

A semiconductor layer H1 for forming the TFT elements T1, T4 is provided on the inorganic moisture-proof film 3. A gate insulating film H2 formed of an inorganic film is provided to cover the semiconductor layer H1.

A conductive film forming the gate electrode H3a of the TFT element T1, the gate electrode H3b of the TFT element T4, and the lower electrode H3c of the capacitive element C1 is patterned on the gate insulating film H2. A first insulating film H4 formed of an inorganic film is formed to cover the gate electrode H3a, the gate electrode H3b, and the lower electrode H3c.

A conductive film forming the upper electrode H5 of the capacitive element C1 is patterned on the first insulating film H4 to face the lower electrode H3c of the capacitive element C1. A second insulating film H6 is formed to cover the upper electrode H5 and the first insulating film H4.

A conductive film forming the electrodes of the TFT elements T1, T4, the wires H7a, H7b, H7c, and the wire H7d connected to the upper electrode H5 of the capacitive element C1 is patterned on the second insulating film H6. The electrodes of the TFT elements T1, T4 and the wires H7a, H7b, H7c are connected to the semiconductor layer H1 through contact holes formed in the gate insulating film H2, the first insulating film H4, and the second insulating film H6. The wire H7d is connected to the upper electrode H5 of the capacitive element C1 through a contact hole formed in the second insulating film H6.

A third insulating film H8 is formed to cover the electrodes of the TFT elements T1, T4, the wires H7a, H7b, H7c, the wire H7d, and the second insulating film H6. The insulating flattening film 4 is formed on the third insulating film H8.

The first electrode is formed on the insulating flattening film 4. The first electrode may have a layered structure of the transparent electrode layer H9a (such as an ITO layer), the reflective electrode layer H9b (such as a metal layer), and the transparent electrode layer H9c (such as an ITO layer). The first electrode is connected to the electrode of the TFT element T4 and the wire H7c through a contact hole formed in the insulating flattening film 4.

An edge cover H10 is formed to cover a part of the insulating flattening film 4 and an end portion of the first electrode. Each of the organic EL layers including the light emitting layer 5R is formed on the first electrode. A second electrode H11 as a transparent electrode layer is formed to cover a part of the edge cover H10 and each of the organic EL layers including the light emitting layer 5R.

The sealing film 6 composed of three layers of an inorganic film 6a, a sealing organic film 6b, and an inorganic film 6c and the cover film 22 are formed to cover the second electrode H11.

As described above, a plurality of layers for forming the plurality of TFT elements including the TFT elements T1, T4 and the capacitive element C1 being formed between the inorganic moisture-proof film 3 and the insulating flattening film 4, as illustrated in FIG. 2, are provided above the first region R1 of the flexible organic EL display panel 31 illustrated in FIG. 1E. The plurality of TFT elements including the TFT elements T1, T4 and the capacitive element C1 are not formed above the second region R2 of the flexible organic EL display panel 31 illustrated in FIG. 1E, and only the terminal portion 27b formed in the same layer as the layer in which the electrodes of the TFT elements T1, T4, the wires H7a, H7b, H7c, and the wire H7d connected to the upper electrode H5 of the capacitive element C1 are formed is provided above the second region R2.

In the present embodiment, a case where the plurality of layers for forming the plurality of TFT elements including the TFT elements T1, T4 and the capacitive element C1 are not provided above the second region R2 is described as an example because a layered film formed above the second region R2 is preferably a layered film having positive film stress (tensile stress) or a layered film having close to substantially zero film stress for reasons described below. However, this is not restrictive, and one or more layers of the gate insulating film H2, the first insulating film H4, the second insulating film H6, and the third insulating film H8 in the plurality of layers for forming the plurality of TFT elements including the TFT elements T1, T4 and the capacitive element C1 may be provided above the second region R2.

Figure 3:
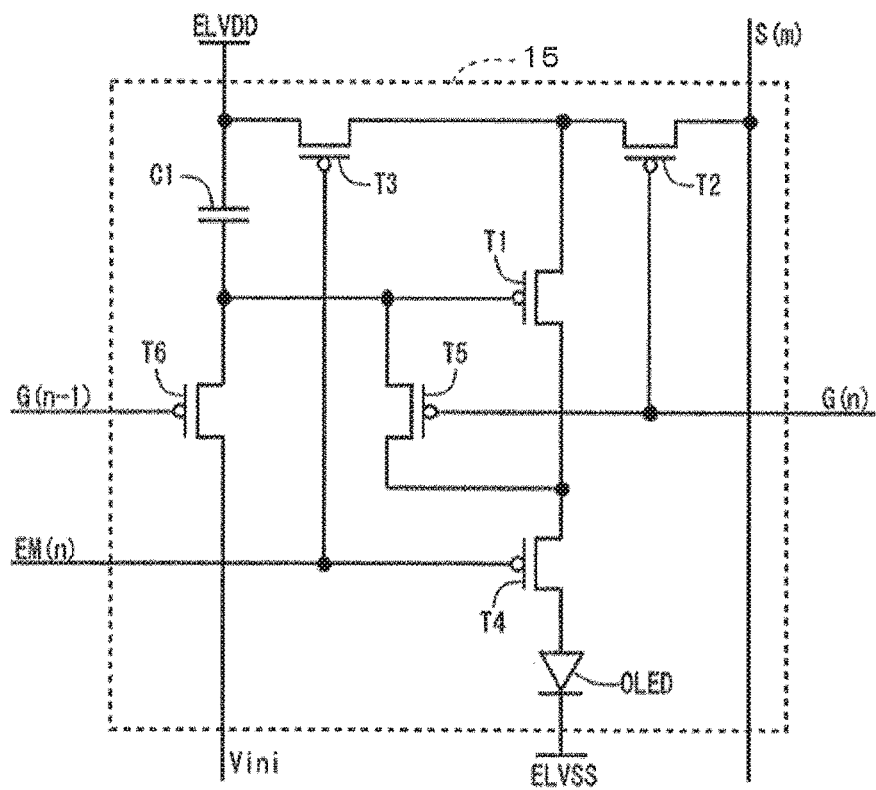
FIG. 3 is a diagram illustrating a configuration of a pixel circuit included in a display region of the flexible organic EL display device illustrated in FIG. 1F.

FIG. 3 is a diagram illustrating a configuration of a pixel circuit 15 included in a display region of the flexible organic EL display device 32 illustrated in FIG. 1F.

As illustrated, a plurality of data lines S(m) and a plurality of scanning signal lines G(n) orthogonal to the plurality of data lines S(m) are arranged in a display region (display region DR illustrated in FIG. 4) of the flexible organic EL display device 32. In the display region, a plurality of light emission control lines EM(n) are arranged to correspond to the plurality of scanning signal lines one-to-one. Furthermore, pixel circuits 15 are provided to correspond to intersection points of the plurality of data lines S(m) and the plurality of scanning signal lines G(n) in the display region. The pixel circuits 15 are provided in such a manner, so that a plurality of pixel matrices are formed in the display region.

Power source lines, which are not illustrated, common to each of the pixel circuits 15 are arranged in the display region. More specifically, a power source line that supplies a high level power source voltage ELVDD for driving an organic EL element, a power source line that supplies a low level power source voltage ELVSS for driving an organic EL element, and a power source line that supplies an initialization voltage Vini are arranged. The high level power source voltage ELVDD, the low level power source voltage ELVSS, and the initialization voltage Vini are supplied from power source circuits, which are not illustrated.

Note that the configuration of the pixel circuit 15 illustrated in FIG. 3 is an example, and other known configurations may also be adopted. The pixel circuit 15 illustrated in FIG. 3 includes one organic EL element OLED, six TFT elements T1 to T6 (drive transistor T1, writing control transistor T2, power source supply control transistor T3, light emission control transistor T4, threshold voltage compensation transistor T5, initialization transistor T6), and one capacitive element C1.

Figure 4A:
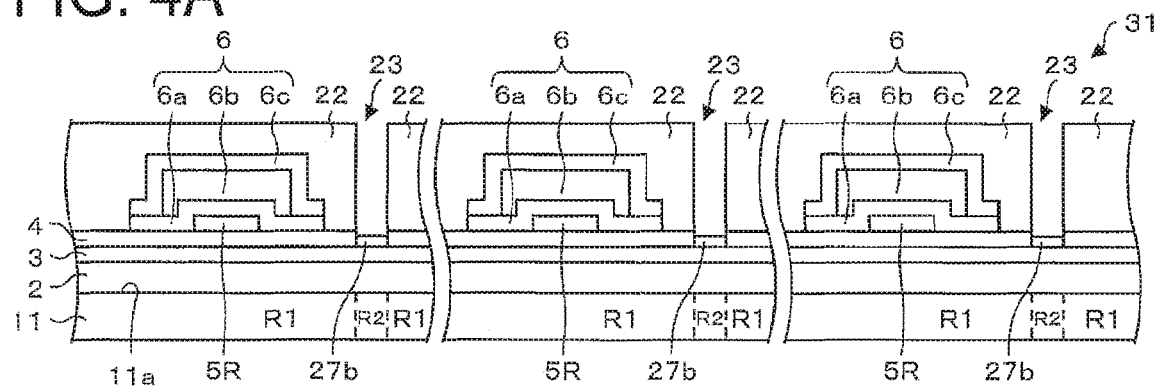
FIG. 4A is a side view illustrating a vicinity of an organic EL layer of the flexible organic EL display panel illustrated in FIG. 1E.
Figure 4B:
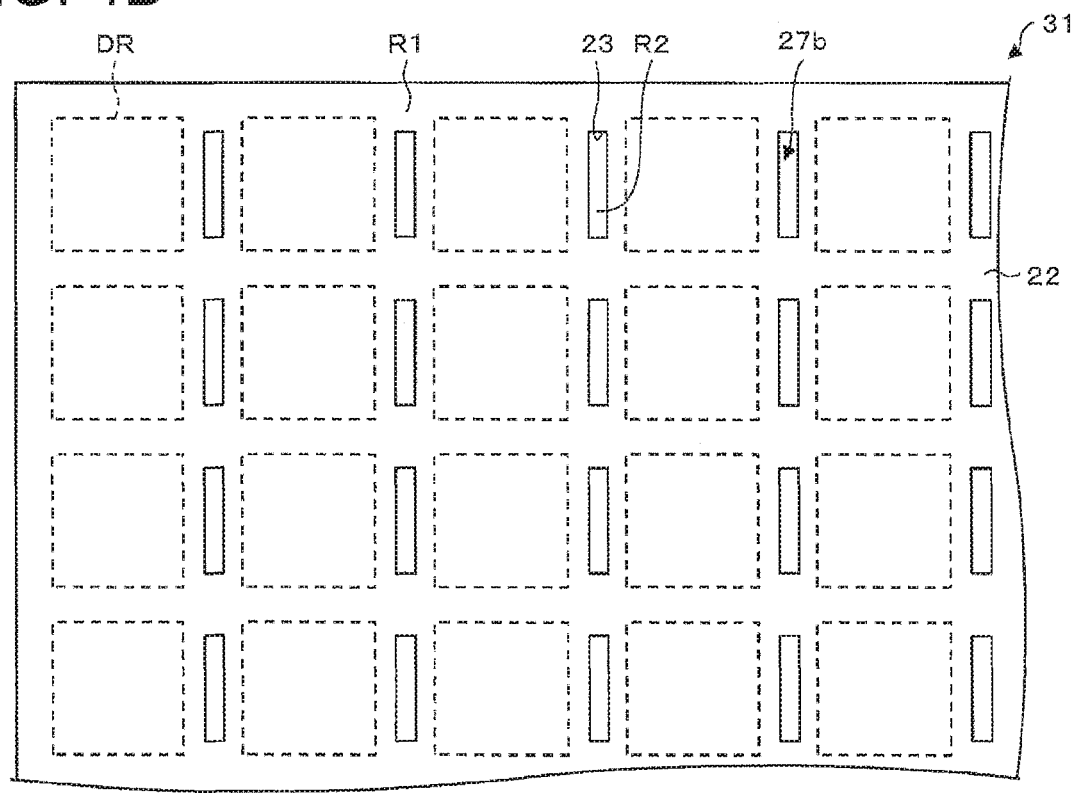
FIG. 4B is a plan view when the flexible organic EL display panel illustrated in FIG. 1E is seen from above.

FIG. 4A is a side view illustrating a vicinity of an organic EL layer of the flexible organic EL display panel 31 illustrated in FIG. 1E. FIG. 4B is a plan view when the flexible organic EL display panel 31 illustrated in FIG. 1E is seen from above.

As illustrated in FIGS. 1D and 1E, the back film 11 is bonded to the position from which the transparent glass substrate 1 having high heat resistance is separated, so that the cover film 22 is formed above the first region R1 of a main surface 11a of the back film 11 to cover around the second region R2 of the main surface 11a of the back film 11, as illustrated in FIG. 4B. A film including the terminal portion 27b formed above the second region R2 of the main surface 11a of the back film 11 is supported by the cover film 22. In other words, the opening 23 of the cover film 22 only needs to be disposed above the second region R2.

As illustrated in FIG. 4B, the display region DR (dotted lines in the diagram) in the flexible organic EL display panel 31 is a part of the first region R1 of the flexible organic EL display panel 31. The plurality of layers between the back film 11 and the cover film 22 illustrated in FIG. 2 are formed in the display region DR in the flexible organic EL display panel 31. The PI layer 2, the inorganic moisture-proof film 3, and the cover film 22 are provided in a region other than the display region DR in the first region R1 of the flexible organic EL display panel 31. The insulating flattening film 4 or one or more layers of the gate insulating film H2, the first insulating film H4, the second insulating film H6, and the third insulating film H8 in FIG. 2 may be provided in the region other than the display region DR as necessary. Moreover, the PI layer 2, the inorganic moisture-proof film 3, the terminal portion 27b, and the insulating flattening film 4 formed to expose the terminal portion 27b are provided in the second region R2 of the flexible organic EL display panel 31.

As illustrated in FIG. 4B, the first region R1 of the flexible organic EL display panel 31 is one coupled region. The second region R2 of the flexible organic EL display panel 31 is a plurality of regions formed by being separated from each other.

Note that in the present embodiment, the sealing film 6 covering the light emitting layers (5R, 5G, 5B) is composed of the three layers of the inorganic film 6a, the sealing organic film 6b, and the inorganic film 6c, but this is not restrictive.

Note that the plurality of layers for forming the plurality of TFT elements including the TFT elements T1, T4 and the capacitive element C1 being formed between the inorganic moisture-proof film 3 and the insulating flattening film 4, the edge cover H10, and the second electrode H11 are omitted in the illustration of the first region R1 of the flexible organic EL display panel 31 in FIG. 4A.

Figure 5:
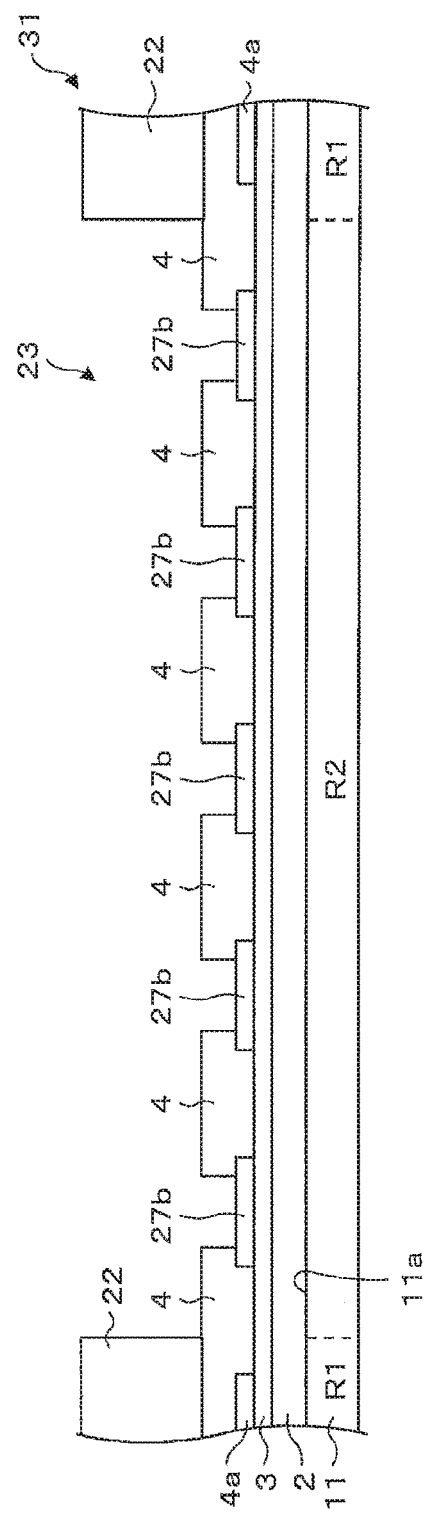
FIG. 5 is a cross-sectional view of a terminal portion of the flexible organic EL display panel illustrated in FIG. 1E.

FIG. 5 is a cross-sectional view of the terminal portion 27b of the flexible organic EL display panel 31 illustrated in FIG. 1E.

As illustrated, the insulating flattening film 4 is formed to expose the terminal portions 27b between the terminal portions 27b in a direction in which the plurality of terminal portions 27b are aligned. An inorganic film 4a in the same layer as the third insulating film H8 illustrated in FIG. 2, the insulating flattening film 4, and the cover film 22 are provided on the inorganic moisture-proof film 3 in the region other than the display region DR in the first region R1 of the flexible organic EL display panel 31.

Therefore, the terminal portions 27b and the insulating flattening film 4 formed above the second region R2 of the main surface 11a of the back film 11 are supported by the cover film 22.

Note that the insulating flattening film 4 is used to secure insulation between the terminal portions 27b in the second region R2.

The terminal portions 27b are wires electrically connected to the plurality of data lines S(m) and the plurality of scanning signal lines G(n) illustrated in FIG. 3 and are portions not covered by the insulating flattening film 4.

An external driver is connected to the terminal portions 27b with an anisotropic conductive film (ACF) including conductive particles, which is not illustrated.

In a case where the terminal portions 27b and the insulating flattening film 4 formed above the second region R2 of the main surface 1a of the transparent glass substrate 1 having high eat resistance are not supported by the cover film 22 in the non-flexible organic EL display panel 24 illustrated in FIG. 1B, following problems may arise.

Figure 6:
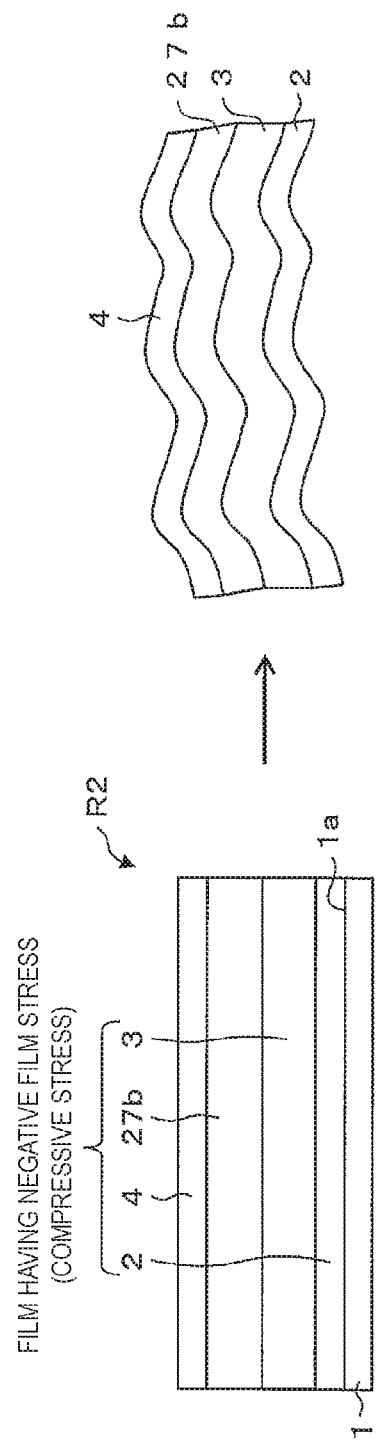
FIG. 6 is a diagram for explaining a reason why a layered film having negative film stress (compressive stress) is extended and wrinkles occur after the stress is released in a case where the layered film having negative film stress (compressive stress) without support by a cover film is separated from a transparent glass substrate having high heat resistance.

FIG. 6 is a diagram illustrating a reason why a layered film having negative film stress (compressive stress) is extended and wrinkles occur after the stress is released in a case where a layered film of the PI layer 2, the inorganic moisture-proof film 3, the terminal portion 27b, and the insulating flattening film 4 that is formed above the second region R2 of the main surface 1a of the transparent glass substrate 1 having high heat resistance, is not supported by the cover film 22, and has negative film stress (compressive stress) is separated from the transparent glass substrate 1 having high heat resistance.

In a case where the layered film of the P1 layer 2, the inorganic moisture-proof film 3, the terminal portion 27b, and the insulating flattening film 4 formed above the second region R2 of the main surface 1a of the transparent glass substrate 1 having high heat resistance, as illustrated in FIG. 6, and a layered film of the PI layer 2, the inorganic moisture-proof film 3, and the terminal portion 27b formed above the second region R2 of the main surface 1a of the transparent glass substrate 1 having high heat resistance, which is not illustrated, are layered films having negative film stress (compressive stress) without support by the cover film 22, these layered films are extended and wrinkles occur by releasing the compressive stress after the layered films are separated from the transparent glass substrate 1 having high heat resistance.

Note that the film stress mentioned above represents force applied to the film formed on the transparent glass substrate 1 having high heat resistance from the transparent glass substrate 1 having high heat resistance, positive film stress represents tensile stress, and negative film stress represents compressive stress.

A state where the film formed on the transparent glass substrate 1 having high heat resistance has positive film stress, in other words, tensile stress is applied to the film formed on the transparent glass substrate 1 having high heat resistance from the transparent glass substrate 1 having high heat resistance indicates a state where the film to be contracting on the transparent glass substrate 1 having high heat resistance is extended by the transparent glass substrate 1 having high heat resistance. In contrast, a state where the film formed on the transparent glass substrate 1 having high heat resistance has negative film stress, in other words, compressive stress is applied to the film formed on the transparent glass substrate 1 having high heat resistance from the transparent glass substrate 1 having high heat resistance indicates a state where the film to be extending on the transparent glass substrate 1 having high heat resistance is contracted by the transparent glass substrate 1 having high heat resistance.

In the present embodiment, even in a case where the layered film of the P1 layer 2, the inorganic moisture-proof film 3, the terminal portion 27b, and the insulating flattening film 4 formed above the second region R2 of the main surface 1a of the transparent glass substrate 1 having high heat resistance, as illustrated in FIG. 6, and a layered film of the PI layer 2, the inorganic moisture-proof film 3, and the terminal portion 27b formed above the second region R2 of the main surface 1a of the transparent glass substrate 1 having high heat resistance, which is not illustrated, are layered films having negative film stress (compressive stress), the cover film 22 is formed above the main surface 1a of the transparent glass substrate 1 having high heat resistance to cover around the second region R2, as illustrated in FIGS. 1B and 1C. Accordingly, the film including the terminal portion 27b and the insulating flattening film 4 formed above the main surface 1a of the transparent glass substrate 1 having high heat resistance in the second region R2 is supported by the cover film 22.

In other words, a length that the film including the terminal portion 27b and the insulating flattening film 4 formed in the second region R2 is extended is defined, so that an effect of reducing occurrence of wrinkles or the like can be obtained.

In the present embodiment, the case where the layered film formed above the second region R2 of the main surface 1a of the transparent glass substrate 1 having high heat resistance is the layered film having negative film stress (compressive stress) is described as an example. However, in terms of further reducing occurrence of wrinkles or the like, the layered film formed above the second region R2 of the main surface 1a of the transparent glass substrate 1 having high heat resistance is preferably a layered film having positive film stress (tensile stress) or a layered film having a film stress close to substantially zero.

For the layered film having positive film stress (tensile stress), the layered film is maintained to be stretched by the cover film 22 around the layered film even after the stress is released, so that occurrence of wrinkles or the like can be further reduced.

Film stress of the layered film formed above the second region R2 of the main surface 1a of the transparent glass substrate 1 having high heat resistance can be obtained by directly measuring the layered film or may be roughly estimated from film stress of each layer. Note that film stress is normally indicated by MPa unit (acting force per unit film thickness).

Note that when film stress of a layered film is roughly estimated from film stress of each layer, a film thickness of each layer needs to be considered, and a greater film thickness has a greater influence on the whole layered film. For example, when film stress of a layered film of an $SiN_x$ film and an $SiO_2$ film is roughly estimated on the assumption that a film thickness of the SiNx film is 200 nm, the film stress of the $SiN_x$ film is −500 MPa, a film thickness of the $SiO_2$ film is 100 nm, and the film stress of the $SiO_2$ film is −200 MPa, the film stress of the layered film of the $SiN_x$ film and the $SiO_2$ film can be roughly estimated to be −400 MPa from (−500 MPa)×200 nm/(200 nm+100 nm)+(−200 MPa)× 100 nm/(200 nm+100 nm)=−400 MPa.

Note that the reason why the layered film composed of the PI layer 2, the inorganic moisture-proof film 3, the terminal portion 27b, and the insulating flattening film 4 illustrated in FIG. 6 has negative film stress is that film thicknesses of the inorganic moisture-proof film 3 and the insulating flattening film 4 are adjusted such that the layered film formed of the PI layer 2, the inorganic moisture-proof film 3, the terminal portion 27b, and the insulating flattening film 4 has negative film stress while the PI layer 2 has film stress close to 0, the inorganic moisture-proof film 3 formed of a silicon nitride film formed by CVD has relatively great negative film stress, the terminal portion 27b being a metal film has negative film stress, and the insulating flattening film 4 being a coating photosensitive organic material has positive film stress.

In the present embodiment, to check the effect of supporting the layered film having negative film stress by the cover film 22, film thicknesses of the inorganic moisture-proof film 3 and the insulating flattening film 4 are adjusted such that the layered film composed of the PI layer 2, the inorganic moisture-proof film 3, the terminal portion 27b, and the insulating flattening film 4 has negative film stress.

However, as described above, the layered film formed above the second region R2 is preferably a layered film having positive film stress (tensile stress) or a layered film having a film stress close to substantially zero.

FIG. 7A is a side view of a terminal portion of a flexible organic EL display panel 31a in which a part of the film having negative film stress is not formed above the second region R2 of the main surface 11a of the back film 11 corresponding to the second region R2 of the main surface 1a of the transparent glass substrate 1 having high heat resistance.

As illustrated in FIG. 7A, an inorganic moisture-proof film 3a having negative film stress as a silicon nitride film formed by CVD is not formed above the second region R2 of the main surface 1a of the transparent glass substrate 1 having high heat resistance. The inorganic moisture-proof film 3a having negative film stress is not formed above the second region R2 of the main surface 11a of the back film 11 in the flexible organic EL display panel 31a.

In this way, by omitting the layer having negative film stress above the second region R2, the layered film formed above the second region R2 can be a layered film having positive film stress (tensile stress) or a layered film having film stress close to substantially zero. Thus, after being separated from the transparent glass substrate 1 having high heat resistance, the layered film formed above the second region R2 is extended and occurrence of wrinkles or the like can be reduced.

As illustrated in FIG. 7B, an inorganic film 4c having minimum necessary negative film stress is formed above the second region R2 of the main surface 11a of the back film 11 in a flexible organic EL display panel 31b. In other words, the inorganic film 4c is covered by a layer forming a terminal portion 27b'. Even in such a case, the layered film formed above the second region R2 is supported by the cover film 22, so that after being separated from the transparent glass substrate 1 having high heat resistance, the layered film is extended by releasing its compressive stress, and thus occurrence of wrinkles or the like can be reduced.

In the flexible organic EL display panel 31b, the inorganic film 4c is formed only in the place of the terminal portion 27b'. Thus, a metal layer of the terminal portion 27b' is raised, which results in an advantage of easier electrical continuity with an anisotropic conductive film (ACF).

Note that the inorganic film 4a and the inorganic film 4c may be in the same layer or different layers, and the inorganic film 4c may be in a layer below the layer forming the terminal portion 27b' and the insulating flattening film 4.

Figure 8:
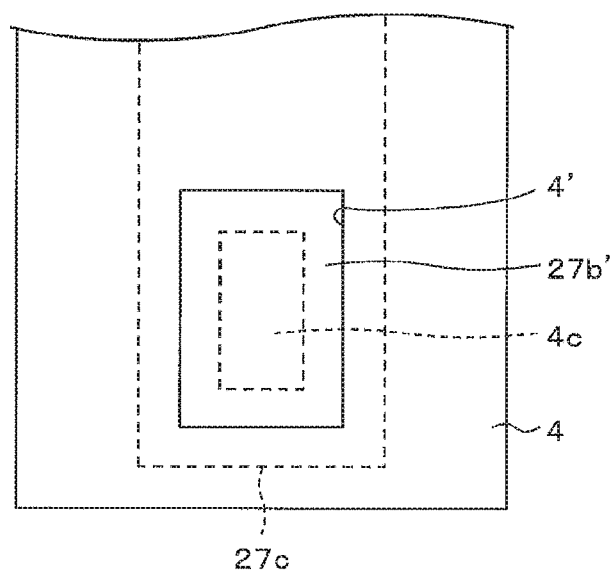
FIG. 8 is a plan view of the terminal portion of the flexible organic EL display panel illustrated in FIG. 7B.

FIG. 8 is a diagram illustrating the terminal portion 27b' of the flexible organic EL display panel 31b illustrated in FIG. 7B.

As illustrated in FIG. 8, the insulating flattening film 4 is formed such that an opening 4' of the insulating flattening film 4 overlaps the inorganic film 4c as a lower layer and the terminal portion 27b' as an upper layer in plan view. In addition, the insulating flattening film 4 is formed such that the inorganic film 4c as the lower layer and the terminal portion 27b' as the upper layer overlap each other in plan view. Accordingly, the metal layer of the terminal portion 27b' is raised. Note that a routing wire 27c is formed as a lower layer of the insulating flattening film 4.

Second Embodiment

Next, a second embodiment of the disclosure will be described with reference to FIGS. 9A to 9F and 10. The present embodiment is different from the first embodiment in that a layered film of a silicon nitride film formed by CVD and an organic film being a coating material is used as a moisture-proof film 3b being a layered film of an inorganic moisture-proof film and an organic film. The other configuration is as described in the first embodiment. For convenience of descriptions, members having the same functions as those of the members illustrated in the diagrams in the first embodiment are denoted by the same reference numerals, and descriptions thereof will be omitted.

FIGS. 9A to 9F are diagrams illustrating a method for producing a flexible organic EL display device 43 that does not include a step of exposing a terminal.

As illustrated in FIG. 9A, a PI layer 2 formed of polyimide resin or the like and a moisture-proof film 3b as a layered film of an inorganic moisture-proof film and an organic film are first layered in order above a first region R1 and a second region R2 of a main surface 1a of a transparent glass substrate 1 having high heat resistance.

The moisture-proof film 3b as the layered film of the inorganic moisture-proof film and the organic film is a layered film of a silicon nitride film that has negative film stress and is formed by CVD and an organic film as a coating material having positive film stress. The moisture-proof film 3b is different from the inorganic moisture-proof films 3, 3a in the first embodiment only formed of a silicon nitride film that has negative film stress and is formed by CVD, and the moisture-proof film 3b is a layered film having positive film stress. Note that adjusting film stress of the moisture-proof film 3b as the layered film of the inorganic moisture-proof film and the organic film can be achieved by appropriately changing a film thickness of the silicon nitride film that has negative film stress and is formed by CVD and a film thickness of the organic film as a coating material having positive film stress, as described in the first embodiment.

Subsequently, as illustrated in FIG. 9B, a thin film transistor element (TFT element), which is not illustrated, is formed on the PI layer 2 and the moisture-proof film 3b as the layered film of the inorganic moisture-proof film and the organic film above the first region R1 and the second region R2 of the main surface 1a of the transparent glass substrate 1 having high heat resistance. An insulating flattening film 4 is formed to cover the TFT element.

Note that respective steps illustrated in FIGS. 9C, 9D, 9E, and 9F are the same as the respective steps illustrated in FIGS. 1C, 1D, 1E, and 1F in the first embodiment described above, so that descriptions thereof will be omitted herein.

Figure 10:
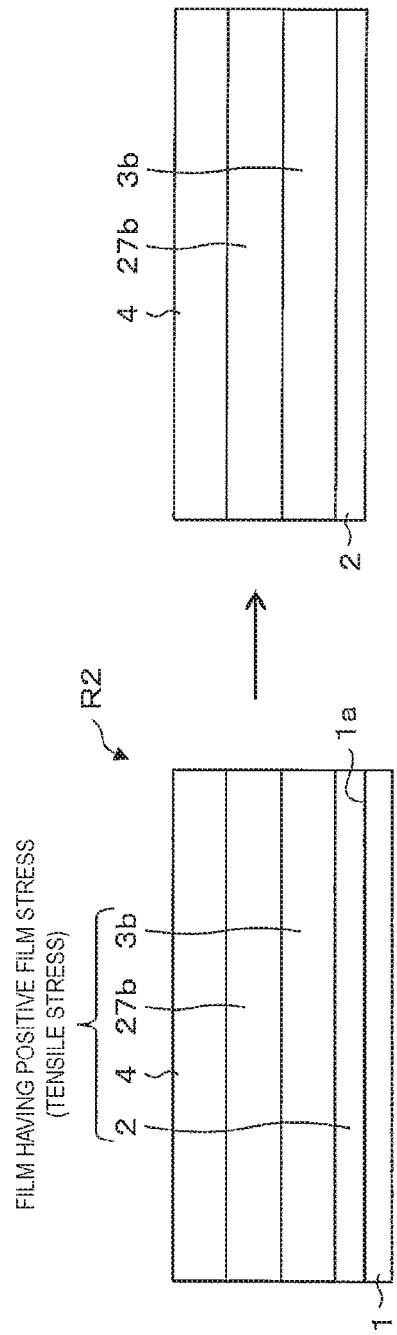
FIG. 10 is a diagram for explaining a reason why occurrence of wrinkles or the like can be reduced in a layered film having positive film stress (tensile stress) after the stress is released in a case where the layered film having positive film stress (tensile stress) is separated from a transparent glass substrate having high heat resistance.

FIG. 10 is a diagram illustrating a reason why occurrence of wrinkles or the like can be reduced in a layered film having positive film stress (tensile stress) after the stress is released in a case where the layered film having positive film stress (tensile stress) is separated from the transparent glass substrate 1 having high heat resistance.

The layered film that is composed of the PI layer 2, the moisture-proof film 3b as the layered film of the inorganic moisture-proof film and the organic film, the terminal portion 27b, and the insulating flattening film 4 and that has positive film stress (tensile stress) illustrated in FIG. 10 is adjusted by the moisture-proof film 3b as the layered film of the inorganic moisture-proof film and the organic film such that the whole film stress is positive.

When the layered film having positive film stress (tensile stress) is separated from the transparent glass substrate 1 having high heat resistance, the layered film is maintained to be stretched by the cover film 22 around the layered film even after the stress is released, so that occurrence of wrinkles or the like can be further reduced.

Third Embodiment

Next, a third embodiment of the disclosure will be described with reference to FIGS. 11A to 11F and 12. The present embodiment is different from the first and second embodiments in that an insulating flattening film 51 being a coating material and an organic inorganic hybrid insulating material is formed instead of the insulating flattening film 4 used in the first and second embodiments described above. The other configuration is as described in the first and second embodiments. For convenience of descriptions, members having the same functions as those of the members illustrated in the diagrams in the first and second embodiments are denoted by the same reference numerals, and descriptions thereof will be omitted.

FIGS. 11A to 11F are diagrams illustrating a method for producing a flexible organic EL display device 54 that does not include a step of exposing a terminal.

As illustrated in FIG. 11A, a PI layer 2 formed of polyimide resin or the like and an inorganic moisture-proof film 3 are first layered in order above a first region R1 and a second region R2 of a main surface 1a of a transparent glass substrate 1 having high heat resistance.

Subsequently, as illustrated in FIG. 11B, a thin film transistor element (TFT element) which is not illustrated, is formed on the PI layer 2 and the inorganic moisture-proof film 3 above the first region R1 and the second region R2 of the main surface 1a of the transparent glass substrate 1 having high heat resistance. An insulating flattening film 51 is formed to cover the TFT element. Specifically, the TFT element is formed only in a display region in the first region R1, and the insulating flattening film 51 covering the TFT film is formed in the first region R1 and the second region R2.

The insulating flattening film 51 is an insulating flattening film formed of an organic inorganic hybrid insulating material, which is a photosensitive material and a coating material. Note that a contact hole is formed in the first region R1 and an opening exposing the terminal portion 27b is formed in the second region R2 in the insulating flattening film 51 by exposure and developing steps.

As the organic inorganic hybrid insulating material, which is the photosensitive material and the coating material, an insulating film coating solution including terminal silanol acrylic poly (phenylmethylsiloxane) that is a hybrid product of mixing a photosensitive acrylic group and polysiloxane, for example, can be used.

In the present embodiment, a photosensitive material is used as the insulating flattening film 51 in consideration of an advantage of omitting a dry etching step. However, in a case where a contact hole and an opening exposing the terminal portion 27b can be formed by dry etching, the insulating flatting film 51 is not limited to a photosensitive material.

Note that respective steps illustrated in FIGS. 11C, 11D, 11E, and 11F are the same as the respective steps illustrated in FIGS. 1C, 1D, 1E, and 1F in the first embodiment described above, and thus descriptions thereof will be omitted herein.

Figure 12:
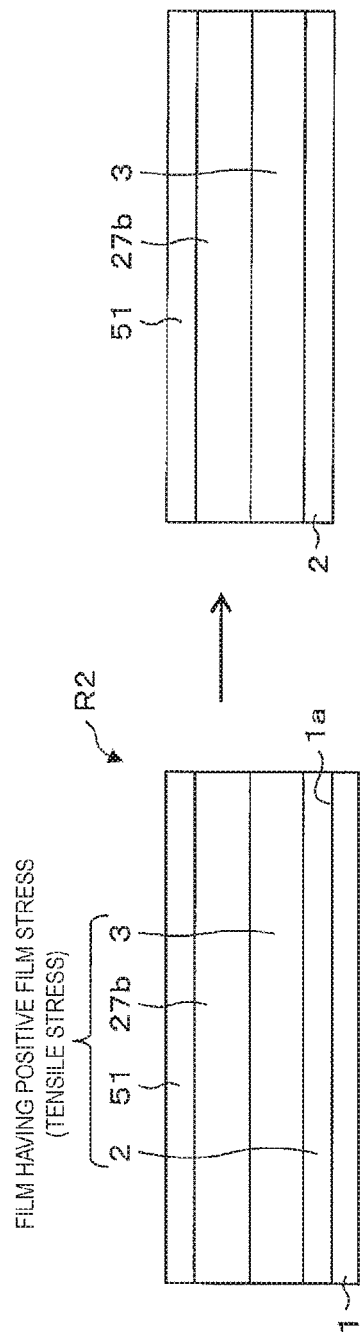
FIG. 12 is a diagram for explaining a reason why occurrence of wrinkles or the like can be reduced in a layered film having positive film stress (tensile stress) after the stress is released in a case where the layered film having positive film stress (tensile stress) is separated from a transparent glass substrate having high heat resistance.
Figure 15A:
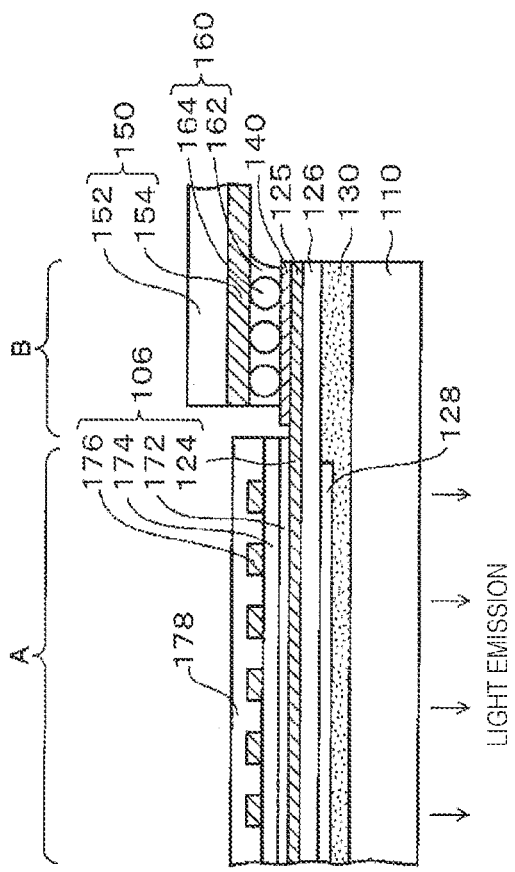
FIGS. 15A and 15B illustrate schematic configurations of a flexible display device using a plastic film as a flexible substrate described in PTL 1.
Figure 15B:
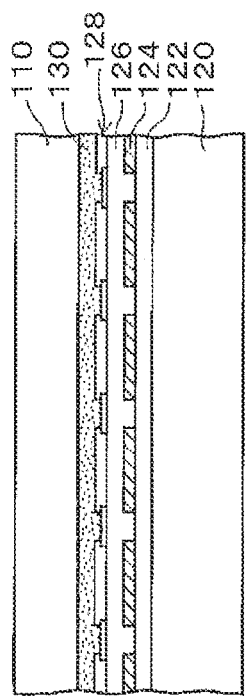
Figure 16A:
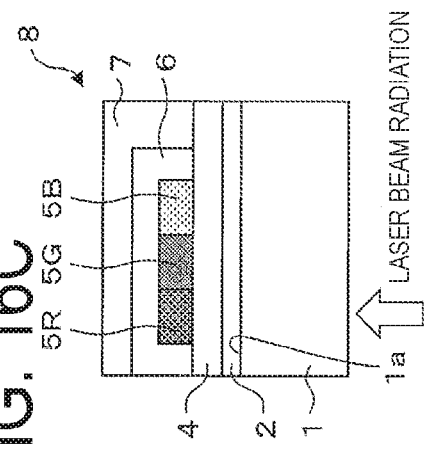
FIGS. 16A to 16F are diagrams illustrating a production method for forming an organic EL element on a glass substrate having high heat resistance, then separating the glass substrate to replace the glass substrate with a flexible substrate.
Figure 16B:
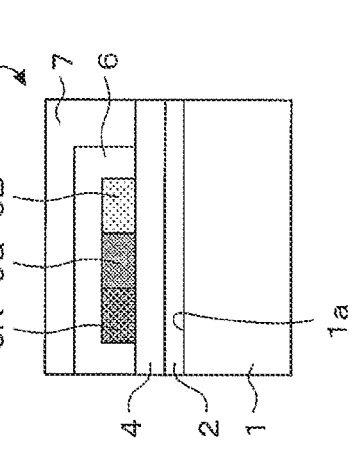
Figure 16C:
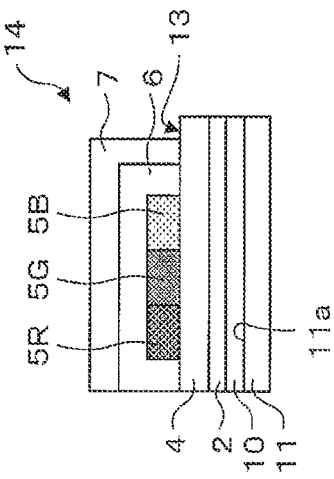
Figure 16D:
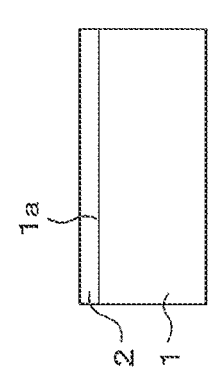
Figure 16E:
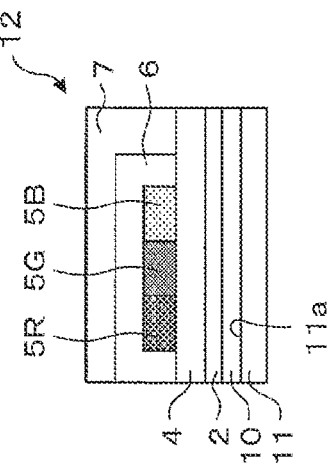
Figure 16F:
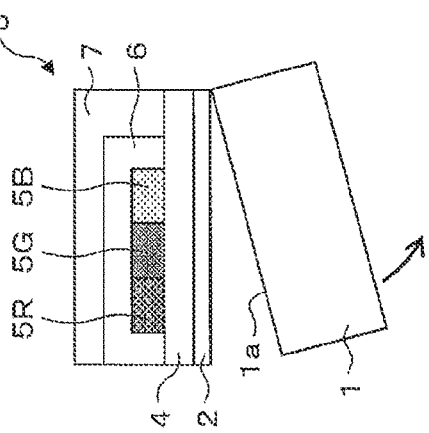
Figure 17A:
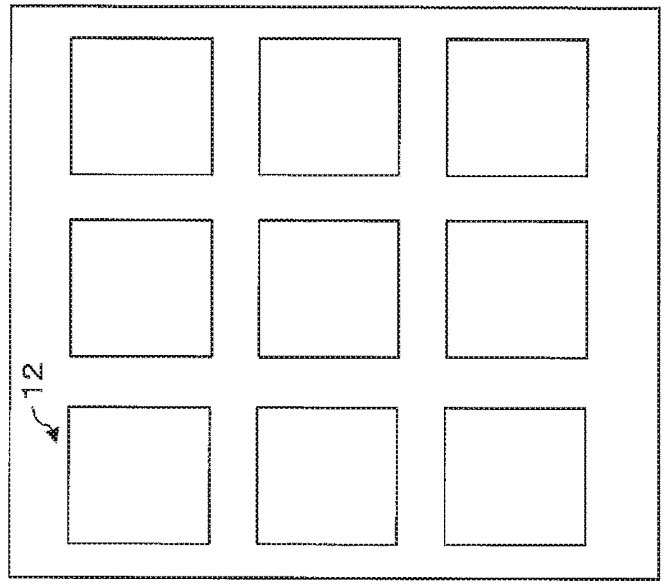
FIG. 17 illustrates a large transparent glass substrate having high heat resistance and a large back film as a large flexible substrate used in the production method illustrated in FIGS. 16A to 16F.
Figure 17B:
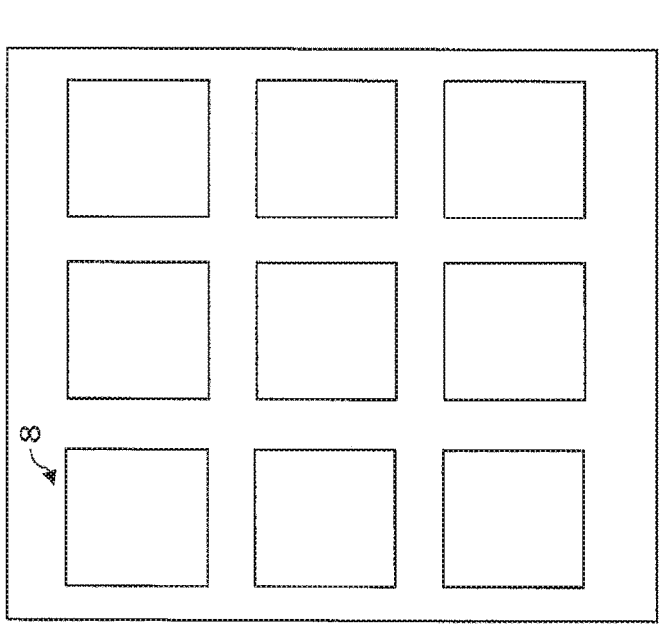

FIG. 12 is a diagram illustrating a reason why occurrence of wrinkles or the like can be reduced in a layered film having positive film stress (tensile stress) after the stress is released in a case where the layered film having positive film stress (tensile stress) is separated from the transparent glass substrate 1 having high heat resistance.

A layered film that is composed of the PI layer 2, the inorganic moisture-proof film 3, the terminal portion 27b, and the insulating flattening film 51 and that has positive film stress (tensile stress) illustrated in FIG. 12 is adjusted by a film thickness of each layer such that the whole film stress is positive.

Note that a value of film stress is adjusted by adjusting a ratio of introduction of a photosensitive acrylic group being an organic group in the insulating flattening film 51. In the present embodiment, the insulating flattening film 51 is a film having positive film stress (tensile stress).

When the layered film having positive film stress (tensile stress) is separated from the transparent glass substrate 1 having high heat resistance, the layered film is maintained to be stretched by the cover film 22 around the layered film even after the stress is released, so that occurrence of wrinkles or the like can be further reduced.

Fourth Embodiment

Next, a fourth embodiment of the disclosure will be described with reference to FIGS. 13A to 13F and 14. The present embodiment is different from the first to third embodiments in that a radiation amount of laser beam to a PI layer 2a formed of polyimide resin or the like is increased and the the properties of the PI layer 2a is changed and contracts. The other configuration is as described in the first to third embodiments. For convenience of descriptions, members having the same functions as those of the members illustrated in the diagrams in the first to third embodiments are denoted by the same reference numerals, and descriptions thereof will be omitted.

FIGS. 13A to 13F are diagrams illustrating a method for producing a flexible organic EL display device 72 that does not include a step of exposing a terminal.

As illustrated in FIG. 13A, a PI layer 2 formed of polyimide resin or the like and an inorganic moisture-proof film 3 are first layered in order above a first region R1 and a second region R2 of a main surface 1a of a transparent glass substrate 1 having high heat resistance.

The non-flexible organic EL display panel 24 illustrated in FIG. 13B is already described above, and descriptions herein are omitted.

Subsequently, as illustrated in FIG. 13C, an interface between the PI layers 2, 2a and the transparent glass substrate 1 having high heat resistance is directly radiated with a laser beam from the transparent glass substrate 1 side having high heat resistance, and the transparent glass substrate 1 having high heat resistance is then separated from the PI layers 2, 2a, as illustrated in FIG. 13D.

In radiation of laser beam illustrated in FIG. 13C, a radiation amount of laser beam to the PI layer 2a above the second region R2 of the main surface 1a of the transparent glass substrate 1 having high heat resistance is greater than a radiation amount of laser beam to the PI layer 2 above the first region R1 of the main surface 1a of the transparent glass substrate 1 having high heat resistance.

The radiation amount of laser beam to the PI layer 2a is preferably greater than or equal to 150 mJ/cm$^2$ and less than or equal to 250 mJ/cm$^2$. The radiation amount of laser beam to the PI layer 2a greater than 250 mJ/cm$^2$ results in great damage, for example, the PI layer 2a is burnt. The radiation amount of laser beam to the PI layer 2a less than 150 mJ/cm$^2$ results in a small effect of changing the properties of the PI layer 2a and contracting the PI layer 2a.

In the present embodiment, it is assumed that the radiation amount of laser beam to the PI layer 2 is 100 mJ/cm$^2$ and the radiation amount of laser beam to the PI layer 2a is 200 mJ/cm$^2$. However, a radiation amount of laser beam is not particularly restrictive as long as it is within a range in which the transparent glass substrate 1 having high heat resistance can be separated from the PI layers 2, 2a and the properties of the PI layer 2a can be changed and can contract.

In the present embodiment, the PI layer 2a is radiated with a stronger laser beam while the PI layer 2 is radiated with a weaker laser beam to satisfy the radiation amount of each laser beam by radiation processing with a laser beam in substantially the same time. However, this is not restrictive.

In the present embodiment, the interface between the PI layers 2, 2a and the transparent glass substrate 1 having high heat resistance is radiated with a laser beam having a wavelength of less than or equal to 355 nm from the transparent glass substrate 1 side having high heat resistance. Specifically, a laser beam having a wavelength of less than or equal to 355 nm, which is light having a wavelength absorbed by the PI layers 2, 2a, is used in the present embodiment. For example, an excimer laser beam having a wavelength of 308 nm, a solid laser beam having a wavelength of 343 nm, and a solid laser beam having a wavelength of 355 nm can be used. Note that in a configuration including a heat absorbing layer (not illustrated), light having a wavelength absorbed by the heat absorbing layer can be used.

Next, as illustrated in FIG. 13E, a back film 11 as a flexible substrate is bonded to the PI layers 2, 2a with an adhesive layer (not illustrated) between the back film 11 and the PI layers 2, 2a, so that a flexible organic EL display panel 71 in which the terminal portion 27b is exposed is completed.

Then, as illustrated in FIG. 13F, a boundary portion between the first region R1 and the second region R2 (boundary portion on the right of the diagram) in the flexible organic EL display device 71 illustrated in FIG. 13E is partitioned by laser, and an external circuit wire (not illustrated) is connected to the terminal portion 27b, to thereby obtain a plurality of flexible organic EL display devices 72.

FIG. 14 is a diagram illustrating a reason why occurrence of wrinkles or the like can be reduced in a layered film having negative film stress (compressive stress) after the stress is released in a case where the layered film having negative film stress (compressive stress) is separated from the transparent glass substrate 1 having high heat resistance.

For a layered film having negative film stress (compressive stress), the layered film is extended by releasing stress when a glass substrate is separated, and wrinkles then occur. On the other hand, for the layered film that has negative film stress (compressive stress) and is composed of the PI layer 2a, the inorganic moisture-proof film 3, the terminal portion 27b, and the insulating flattening film 4 illustrated in FIG. 14, the layered film is contracted more than an expected amount of extension mentioned above by increasing the radiation amount of laser for the PI layer 2a and changing the properties of the PI layer 2a before the transparent glass substrate 1 having high heat resistance is separated, as described above. Therefore, when the layered film that has negative film stress (compressive stress) and is composed of the PI layer 2a, the inorganic moisture-proof film 3, the terminal portion 27b, and the insulating flattening film 4 illustrated in FIG. 14 is separated from the transparent glass substrate 1 having high heat resistance, occurrence of wrinkles or the like can be reduced in the layered film having negative film stress (compressive stress) after the stress is released.

Furthermore, in a case where the layered film that has negative film stress (compressive stress) and is composed of the PI layer 2a, the inorganic moisture-proof film 3, the terminal portion 27b, and the insulating flattening film 4 illustrated in FIG. 14 is separated from the transparent glass substrate 1 having high heat resistance, the layered film is maintained to be stretched by the cover film 22 around the layered film even after the stress is released, so that occurrence of wrinkles or the like can be further reduced.

It is needless to say that the present embodiment can be used in combination with any of the first to third embodiments described above.

Supplement

To solve the above-mentioned problems, a flexible display panel of aspect 1 of the disclosure is a flexible display panel including a plurality of display elements and a plurality of terminals on a main surface of a flexible substrate. The main surface of the flexible substrate is divided into a first region including one coupled region and a second region including a plurality of regions formed by being separated from each other. The plurality of display elements are formed above a display region as a part of the first region. The plurality of terminals are formed above the second region. A flexible film provided as an uppermost layer on the main surface of the flexible substrate includes an opening. The opening is disposed above the second region and has a shape surrounded by the flexible film.

According to the configuration above, the flexible film can support the film formed above the second region of the main surface of the flexible substrate. Thus, the flexible display panel that reduces occurrence of wrinkles in the film formed above the second region without a need for a separate step of exposing a terminal can be achieved.

In a flexible display panel of aspect 2 of the disclosure, the flexible display panel being according to above-described aspect 1, an active element electrically connected to each of the display elements preferably overlaps the display region in plan view. An inorganic insulating film included in the active element or an inorganic insulating flattening film covering the active element does not preferably overlap the second region in plan view.

According to the configuration above, the flexible display panel that reduces occurrence of wrinkles in the film formed above the second region can be achieved.

A flexible display panel of aspect 3 of the disclosure, the flexible display panel being according to above-described aspect 1 or 2, preferably includes an inorganic moisture-proof film. The inorganic moisture-proof film does not preferably overlap the second region in plan view.

According to the configuration above, the flexible display panel that reduces occurrence of wrinkles in the film formed above the second region can be achieved.

A flexible display panel of aspect 4 of the disclosure, the flexible display panel being according to above-described aspect 1, preferably includes an inorganic moisture-proof film. An active element electrically connected to each of the display elements preferably overlaps the display region in plan view. One layer of a plurality of inorganic layers included in the active element, an inorganic insulating flattening film covering the active element, or the inorganic moisture-proof film are preferably separated from each other above the second region and covered by a metal film forming the terminals.

According to the configuration above, the layer forming the terminals is raised, which results in easier electrical continuity with an anisotropic conductive film (ACF).

In a flexible display panel of aspect 5 of the disclosure, the flexible display panel being according to above-described aspect 4, an insulating flattening film including an opening is preferably formed above the second region. The insulating flattening film is preferably an organic insulating flattening film or an organic inorganic hybrid insulating flattening film. The opening of the insulating flattening film preferably overlaps one layer of the plurality of inorganic layers included in the active element, the inorganic insulating flattening film covering the active element, the inorganic moisture-proof film, and the layer forming the terminals in plan view.

According to the configuration above, the layer forming the terminals is raised, which results in easier electrical continuity with the ACF.

In a flexible display panel of aspect 6 of the disclosure, the flexible display panel being according to above-described aspect 5, the insulating flattening film may be also formed in the display region. The active element may be electrically connected to each of the display elements through the opening of the insulating flattening film in the display region.

According to the configuration above, the flexible display panel in which the insulating flattening film is formed in the same layer above the display region and the second region can be achieved.

In a flexible display panel of aspect 7 of the disclosure, the flexible display panel being according to above-described aspect 5 or 6, the insulating flattening film preferably includes a photosensitive material.

According to the configuration above, the opening can be formed in the insulating flattening film by exposure and developing steps.

In a flexible display panel of aspect 8 of the disclosure, the flexible display panel being according to above-described aspect 1 or 2, a moisture-proof film being a layered film composed of an inorganic moisture-proof film and an organic film is preferably provided at least above the second region.

According to the configuration above, the flexible display panel that reduces occurrence of wrinkles in the film formed above the second region can be achieved.

In a flexible display panel of aspect 9 of the disclosure, the flexible display panel being according to any of above-described aspects 1 to 8, a polyimide film containing polyimide resin is preferably formed as a common layer above the first region and between the flexible substrate and the film forming the plurality of terminals above the second region. The polyimide film above the second region preferably includes a film obtained by contracting the polyimide film above the first region.

According to the configuration above, the polyimide film above the second region is a film contracting more than the polyimide film above the first region. Thus, the flexible display panel that reduces occurrence of wrinkles in the film formed above the second region can be achieved.

In a flexible display panel of aspect 10 of the disclosure, the flexible display panel being according to any of above-described aspects 1 to 9, each of the display elements may include an organic electroluminescence display element.

According to the configuration above, the flexible display panel including the organic electroluminescence display element as each of the display elements can be achieved.

A flexible display device of aspect 11 of the disclosure includes a flexible display device formed by partitioning the flexible display panel according to any of aspects 1 to 10.

According to the configuration above, the flexible display device that reduces occurrence of wrinkles in the film formed above the second region can be achieved.

To solve the above-mentioned problems, a method for producing a flexible display panel of aspect 12 of the disclosure includes a method for producing a flexible display panel including a plurality of display elements and a plurality of terminals on a main surface of a flexible substrate. The main surface of a heat-resistant substrate is divided into a first region including one coupled region and a second region including a plurality of regions formed by being separated from each other. The method for producing a flexible display panel includes a first step of forming a layered film above the first region and the second region, a second step of forming the plurality of display elements on the layered film above a display region as a part of the first region and forming the plurality of terminals on the layered film above the second region, a third step of providing a flexible film including an opening as an uppermost layer on the main surface of the heat-resistant substrate and disposing the opening having a shape surrounded by the flexible film above the second region, a fourth step of separating the heat-resistant substrate, and a fifth step of bonding the main surface of the flexible substrate to the surface from which the heat-resistant substrate is separated.

According to the method above, the flexible film can support the film formed above the second region of the main surface of the flexible substrate. Thus, the method for producing a flexible display panel that reduces occurrence of wrinkles in the film formed above the second region without a need for a separate step of exposing a terminal can be achieved.

In a method for producing a flexible display panel of aspect 13 of the disclosure, the method for producing a flexible display panel being according to above-described aspect 12, a layered film having positive film stress is preferably formed at least above the second region in the first step.

According to the method above, the method for producing a flexible display panel that reduces occurrence of wrinkles in the film formed above the second region without a need for a separate step of exposing a terminal can be achieved.

In a method for producing a flexible display panel of aspect 14 of the disclosure, the method for producing a flexible display panel being according to above-described aspect 12 or 13, a polyimide film containing polyimide resin is preferably included in the layered film formed above the first region and the second region in the first step. The heat-resistant substrate preferably includes a substrate through which at least part of a wavelength region of laser beam is transmitted. The polyimide film is preferably radiated with the laser beam through the heat-resistant substrate and a portion lower than the polyimide film including the heat-resistant substrate is preferably separated in the fourth step.

According to the method above, the method for producing a flexible display panel including the step of radiating the laser beam and separating the portion lower than the polyimide film including the heat-resistant substrate can be achieved.

In a method for producing a flexible display panel of aspect 15 of the disclosure, the method for producing a flexible display panel being according to above-described aspect 14, a radiation amount of laser beam to the polyimide film above the second region is preferably greater than a radiation amount of laser beam to the polyimide film above the first region in the fourth step.

According to the method above, the radiation amount of laser beam to the polyimide film above the second region is greater than the radiation amount of laser beam to the polyimide film above the first region. Thus, the method for producing a flexible display panel that can reduce occurrence of wrinkles in the film formed above the second region can be achieved.

In a method for producing a flexible display panel of aspect 16 of the disclosure, the method for producing a flexible display panel being according to above-described aspect 15, the radiation amount of laser beam to the polyimide film above the second region is preferably greater than or equal to 150 mJ/cm$^2$ and less than or equal to 250 mJ/cm$^2$.

According to the method above, the method for producing a flexible display panel that can reduce occurrence of wrinkles in the film formed above the second region can be achieved.

In a method for producing a flexible display panel of aspect 17 of the disclosure, the method for producing a flexible display panel being according to any of above-described aspects 14 to 16, the laser beam may include an excimer laser beam or a solid laser beam.

According to the method above, the method for producing a flexible display panel that can reduce occurrence of wrinkles in the film formed above the second region can be achieved by using the excimer laser beam or the solid laser beam.

Supplementary Information

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

INDUSTRIAL APPLICABILITY

The disclosure is applicable to a flexible display panel, a flexible display device, and a method for producing a flexible display panel.

REFERENCE SIGNS LIST

1 Transparent glass substrate having high heat resistance (heat-resistant substrate)
1a Main surface of transparent glass substrate having high heat resistance (main surface of heat-resistant substrate)
2 PI layer (polyimide film)
2a PI layer (polyimide film)
3 Inorganic moisture-proof film
3a Inorganic moisture-proof film
3b Layered film of inorganic moisture-proof film and organic film (moisture-proof film)
4 Insulating flattening film (organic insulating flattening film)
4a Inorganic film (one layer of a plurality of inorganic layers, inorganic insulating flattening film)
4' Opening
5R Light emitting layer
5G Light emitting layer
5B Light emitting layer
6 Sealing film
11 Back film (flexible substrate)
11a Main surface of back film (main surface of flexible substrate)
22 Cover film (flexible film)
23 Opening (opening of flexible film)
24 Non-flexible organic EL display panel
27b Terminal portion (terminal)
27b' Terminal portion (terminal)
31 Flexible organic EL display panel (flexible display panel)
31a Flexible organic EL display panel (flexible display panel)
31b Flexible organic EL display panel (flexible display panel)
31c Flexible organic EL display panel (flexible display panel)
32 Flexible organic EL display device (flexible display device)
41 Non-flexible organic EL display panel
42 Flexible organic EL display panel (flexible display panel)
43 Flexible organic EL display device (flexible display device)
51 Insulating flattening film (organic inorganic hybrid insulating flattening film)
52 Non-flexible organic EL display panel
53 Flexible organic EL display panel (flexible display panel)
54 Flexible organic EL display device (flexible display device)
70 Non-flexible organic EL display panel
71 Flexible organic EL display panel (flexible display panel)
72 Flexible organic EL display device (flexible display device)
R1 First region
R2 Second region
T1 to T6 TFT element (active element)
H2 Gate insulating film (inorganic insulating film included in active element)
H4 First insulating film (inorganic insulating film included in active element)
H6 Second insulating film (inorganic insulating film included in active element)
H8 Third insulating film (inorganic insulating flattening film) DR Display region

The invention claimed is:
1. A flexible display panel comprising:
a plurality of display elements and a plurality of terminals on a main surface of a flexible substrate, wherein
the main surface of the flexible substrate is divided into a first region including one coupled region and a plurality of second regions separated from each other within the flexible display panel,
the plurality of display elements are above a plurality of display regions as a portion of the first region within the flexible display panel,
the plurality of terminals are above the plurality of second regions,
a flexible film provided as an uppermost layer on the main surface of the flexible substrate includes a plurality of openings,
the plurality of openings are above the plurality of second regions and each of the plurality of openings is surrounded by the flexible film,
a polyimide film containing polyimide resin defines a common layer above the first region and between the flexible substrate and the film defining the plurality of terminals above the plurality of second regions, and the polyimide film above the plurality of second regions is contracted more than the polyimide film above the first region.

2. The flexible display panel according to claim 1, wherein
an insulating flattening film including plurality of openings is above the plurality of second regions,
the insulating flattening film includes an organic insulating flattening film or an organic inorganic hybrid insulating flattening film, and
the plurality of openings of the insulating flattening film overlap one layer of a plurality of inorganic layers included in an active element, an inorganic insulating flattening film covering the active element, an inorganic moisture-proof film, and a layer in which the terminals are located in a plan view.

3. The flexible display panel according to claim 2, wherein
the insulating flattening film is in the plurality of display regions, and
the active element is electrically connected to each of the display elements through an opening of the insulating flattening film in the plurality of display regions.

4. The flexible display panel according to claim 2, wherein the insulating flattening film is made of a photosensitive material.

5. The flexible display panel according to claim 1, wherein each of the display elements includes an organic electroluminescence display element.

6. A flexible display device defined by partitioning the flexible display panel according to claim 1.

7. A method for producing a flexible display panel including a plurality of display elements and a plurality of terminals on a main surface of a flexible substrate, a main surface of a heat-resistant substrate being divided into a first region including one coupled region and a plurality of second regions formed by being separated from each other within the flexible display panel, the method comprising:
a first step of forming a layered film above the first region and the plurality of second regions;
a second step of forming the plurality of display elements on the layered film above a plurality of display regions as a portion of the first region and forming the plurality of terminals on the layered film above the plurality of second regions;
a third step of providing a flexible film including a plurality of openings as an uppermost layer on the main surface of the heat-resistant substrate and each of the plurality of openings is surrounded by the flexible film above the plurality of second regions;
a fourth step of separating the heat-resistant substrate;
a fifth step of bonding the main surface of the flexible substrate to a surface from which the heat-resistant substrate is separated, wherein
a layered film having positive film stress is formed at least above the second region in the first step, and
a polyimide film containing polyimide resin is included in the layered film formed above the first region and the plurality of second regions in the first step,
the heat-resistant substrate is a substrate through which at least portion of a wavelength region of laser beam is transmitted,
the polyimide film is radiated with the laser beam through the heat-resistant substrate and a portion positioned lower than the polyimide film including the heat-resistant substrate is separated in the fourth step, and a radiation amount of the laser beam to the polyimide film above the plurality of second regions is greater than a radiation amount of the laser beam to the polyimide film above the first region in the fourth step.

8. The method for producing a flexible display panel according to claim 7, wherein a layered film having positive film stress is formed at least above the second region in the first step.

9. The method for producing a flexible display panel according to claim 7, wherein the radiation amount of the laser beam to the polyimide film above the plurality of second regions is greater than or equal to 150 mJ/cm$^2$ and less than or equal to 250 mJ/cm$^2$.

10. The method for producing a flexible display panel according claim 7, wherein the laser beam includes an excimer laser beam or a solid laser beam.

11. A flexible display panel comprising:
a plurality of display elements and a plurality of terminals on a main surface of a flexible substrate, wherein
the main surface of the flexible substrate is divided into a first region including one coupled region and a second region including a plurality of regions separated from each other,
the plurality of display elements are above a display region as a portion of the first region,
the plurality of terminals are above the second region,
a flexible film provided as an uppermost layer on the main surface of the flexible substrate includes an opening,
the opening is above the second region and is surrounded by the flexible film,
a polyimide film containing polyimide resin defines a common layer above the first region and between the flexible substrate and a film forming the plurality of terminals above the second region, and
the polyimide film above the second region is contracted more than the polyimide film above the first region.

12. The flexible display panel according to claim 11, wherein
an active element electrically connected to each of the plurality of display elements overlaps the display region in a plan view, and
an inorganic insulating film included in the active element or an inorganic insulating flattening film covering the active element does not overlap the second region in the plan view.

13. The flexible display panel according to claim 11, further comprising:
an inorganic moisture-proof film, wherein the inorganic moisture-proof film does not overlap the second region in a plan view.

14. The flexible display panel according to claim 11, wherein
an insulating flattening film including an opening is above the second region,
the insulating flattening film includes an organic insulating flattening film or an organic inorganic hybrid insulating flattening film, and
the opening of the insulating flattening film overlaps one layer of a plurality of inorganic layers included in an active element, the inorganic insulating flattening film covering the active element, an inorganic moisture-proof film, and a layer defining the plurality of terminals in a plan view.

15. The flexible display panel according to claim 14, wherein
the insulating flattening film is in the display region, and the active element is electrically connected to each of the plurality of display elements through the opening of the insulating flattening film in the display region.

16. The flexible display panel according to claim 11, wherein each of the plurality of display elements includes an organic electroluminescence display element.

17. A flexible display device defined by partitioning the flexible display panel according to claim 11.

* * * * *